US 7,919,362 B2

(12) United States Patent
Bolis

(10) Patent No.: US 7,919,362 B2
(45) Date of Patent: Apr. 5, 2011

(54) METHOD FOR PREPARING A COVER FOR PROTECTING A COMPONENT ON A SUBSTRATE

(75) Inventor: Sébastien Bolis, Crolles (FR)

(73) Assignee: Commissariat A l'Energie Atomique, Paris (FR)

( * ) Notice: Subject to any disclaimer, the term of this patent is extended or adjusted under 35 U.S.C. 154(b) by 187 days.

(21) Appl. No.: 12/011,333

(22) Filed: Jan. 25, 2008

(65) Prior Publication Data

US 2008/0180890 A1 Jul. 31, 2008

(30) Foreign Application Priority Data

Jan. 26, 2007 (FR) ...................................... 07 52907

(51) Int. Cl.
*H01L 21/00* (2006.01)
(52) U.S. Cl. .......................... 438/127; 438/106; 361/824
(58) Field of Classification Search .................. 438/127, 438/106; 361/824
See application file for complete search history.

(56) References Cited

U.S. PATENT DOCUMENTS

| 4,554,506 | A  | * | 11/1985 | Faure et al. ............... 324/750.25 |
| 5,926,199 | A  | * | 7/1999  | Matoba et al. ................ 347/204 |
| 7,004,015 | B2 | * | 2/2006  | Chang-Chien et al. ........... 73/52 |
| 7,635,901 | B2 | * | 12/2009 | Robert ........................... 257/415 |
| 7,648,859 | B2 | * | 1/2010  | Robert ........................... 438/127 |
| 2007/0126068 | A1 | * | 6/2007 | Robert ........................... 257/414 |
| 2008/0180890 | A1 | * | 7/2008 | Bolis ............................ 361/679 |

FOREIGN PATENT DOCUMENTS

| FR | 2864341 A1 | 6/2005 |
| JP | 2008194816 A * | 8/2008 |
| WO | WO 2005061374 A1 * | 7/2005 |
| WO | WO 2005061375 A1 * | 7/2005 |

OTHER PUBLICATIONS

French Preliminary Search Report, FA 690012—FR 0752907 (Nov. 8, 2007) pp. 2.
Takeuchi, Shoji et al., "Parylene flexible Neural Probe With Micro Fluidic Channel", University of Tokyo, Tokyo Japan, pp. 208-211, (2004).
Popescu, Dan S. et al., "Buckled Membranes For Microstructures" University of Twente, pp. 188-192, (1994).
Popescu, Dan S. et al., "Silicon Active Microvalves Using Buckled Membranes For Actuation", pp. 305-308, (Jun. 29, 1995).
Kumar, Rakesh et al., "New High Temperature Polymer Thin Coating For Power Electronics", Specialty Coating Systems—Cookson Electronics, Indianapolis, IN 46278, pp. 1247-1249, (2004).

* cited by examiner

*Primary Examiner* — Laura M Menz
(74) *Attorney, Agent, or Firm* — Nixon Peabody LLP

(57) ABSTRACT

A method for preparing a cover on a substrate in particular for the encapsulation of electronic, optical, optoelectronic components, of the electromechanical microsystems type, also known as Micro-Electro-Mechanical Systems (MEMS) or optoelectromechanical microsystems, also known as Micro-Opto-Elect-Mechanical systems (MOEMS), joined to the substrate.

26 Claims, 17 Drawing Sheets

METHOD FOR PREPARING A COVER FOR PROTECTING A COMPONENT ON A SUBSTRATE

CROSS-REFERENCE TO RELATED PATENT APPLICATION OR PRIORITY CLAIM

This application claims the benefit of a French Patent Application No. 07-52907, filed on Jan. 26, 2007, the disclosure of which is incorporated herein in its entirety by reference.

TECHNICAL FIELD

The present invention relates to a method for preparing a cover on a substrate in particular for the encapsulation of electronic, optical, optoelectronic components, of the electromechanical Microsystems type, also known as Micro-Electro-Mechanical Systems (MEMS) or optoelectromechanical microsystems, also known as Micro-Opto-Electro-Mechanical Systems (MOEMS), joined to the substrate. In the rest of the description, use is made of component or occasionally microsystem.

PRIOR ART

In the field of encapsulation, the components, of the Microsystems type in particular, comprise fragile functional elements which must be protected for subsequent conventional assembly operations. These Microsystems are usually made collectively on a wafer of semiconductor material. During the encapsulation, a unitary cover may also be added on to each of the components, itself issuing from a wafer, but increasingly, attempts are made to proceed collectively, by thin film deposition, by providing sacrificial material on the component to bound the internal shape of the cavity to be bounded by the cover, the said sacrificial material being finally removed. Such a collective fabrication is relatively lengthy and complicated, the sacrificial material must be deposited, modelled, the cover material deposited, the sacrificial material must be removed via an orifice in the cover, and finally, the orifice of the cover must be closed. Furthermore, the covers obtained risk being not robust enough in bending and of not withstanding the plastic injection step with which the component is overmoulded.

As to the collective transfer of the cover by using wafer bonding, this technique demands wafer bonding equipment, which is not a standard resource of the microelectronics industry.

SUMMARY OF THE INVENTION

The object of the present invention is precisely to propose a method for preparing a cover for protecting a component on a substrate, which does not have the abovementioned drawbacks.

One object of the invention is the preparation of a protective cover which is simple and which serves to avoid the use of sacrificial material for defining the internal volume of the cavity bounded by the cover.

A further object of the method according to the invention is to prepare a more robust cover than the thin film covers.

A further object of the invention is to prepare a sealed cover bounding a cavity of which the pressure can be controlled.

For this purpose, the present invention proposes a method for preparing a cover for protecting a component housed on or in a substrate comprising the following steps:

definition on the substrate of at least one zone for anchoring the cover of the substrate, offset from a central zone in which the component is located, formation of a buckling layer having a monolayer or a plurality of stacked sub-layers, on the substrate, extending on the central zone and beyond, the buckling layer having an adhesion to the substrate, in the central zone, lower than that presented in the anchoring zone, buckling of the buckling layer so that it bounds a cavity at the central zone and is anchored to the substrate at the anchoring zone, in which the definition step can be carried out before, during or after the formation step but before the buckling step, and the buckling step can be carried out during or after the formation step.

The buckling layer may be formed by the deposition of a thin film such as chemical vapour deposition, physical vapour deposition, electrolysis, epitaxy, thermal oxidation, vacuum deposition, film lamination, spin deposition, spraying, moulding, molecular bonding, eutectic welding, organic bonding, anodic bonding.

The formation of the buckling layer may include a step of structuring of the buckling layer.

The buckling layer or the sub-layers of the buckling layer may be made from an organic material selected from photosensitive resins such as benzocyclobutene or polyethylene terephthalate, parylene, polydimethylsiloxane, a metallic material selected from titanium, carbon, aluminium or alloys thereof, an inorganic material selected from silicon, silicon germanium, silicon dioxide, silicon nitride, silicon carbide, diamond carbon, titanium nitride.

The buckling may be carried out by maintaining the buckling layer or at least one sub-layer of the buckling layer.

The stress may be induced by the substrate which has a thermal expansion coefficient higher than that of the buckling layer or of the buckling sub-layer.

As an alternative or in combination, the stress may be induced by at least one sub-layer of the buckling layer which has a thermal expansion coefficient higher than that of another sub-layer of the buckling layer.

The method may comprise a step of formation of at least one compression element at the periphery of the buckling layer, at the anchoring zone, the said compression element having a thermal expansion coefficient higher than that of the buckling layer or of at least one of the sub-layers of the buckling layer and a stiffness higher than that of the buckling layer, the stress being induced by the compression element.

As an alternative or in combination, the buckling may be obtained by a localized ion implantation of the buckling layer at the central zone optionally coupled with a simultaneous and/or subsequent thermal activation.

The method may comprise a step of depositing a coating having a thermal expansion coefficient lower than that of the buckling layer at the periphery of the buckling layer, after the buckling, this deposition step being followed by a heat treatment step.

As an alternative or in combination, the buckling may be obtained by epitaxial stress deposition of at least one sub-layer of the buckling layer, the said step optionally being coupled with a heat treatment.

As an alternative or in combination, the buckling may be obtained by plasma hardening of at least one sub-layer of the buckling layer, the said step optionally being coupled with a heat treatment.

It may be possible for the compression element to be subjected to an ion implantation, a plasma hardening, an epitaxial stress deposition.

The anchoring zone may be defined by the preparation of one or more anchoring points of the buckling layer, hollowed in the substrate, beyond the central zone, before the formation of the buckling layer.

As an alternative or in combination, the anchoring zone may be defined by localized treatment of the substrate and/or of the buckling layer in order to increase the adhesion of the buckling layer to the substrate beyond the central zone.

The treatment may be an oxygen plasma application to increase the surface roughness or to chemically activate the surface.

As an alternative or in combination, the anchoring zone may be defined by localized deposition on the substrate and/or the buckling layer of a material suitable for increasing the adhesion of the buckling layer to the substrate beyond the central zone.

The material is an adhesive, a eutectic weld, a bonding primer.

As an alternative or in combination, the anchoring zone may be defined by localized deposition on the substrate and/or the buckling layer of a material suitable for decreasing the adhesion of the buckling layer to the substrate beyond the central zone.

The material may be a slightly adhesive or non-adhesive material selected from polytetrafluoroethylene, silicones, parylene, polydimethysiloxane, photosensitive resins.

The material may be a material suitable for being evaporated or for being thermally degraded, the buckling layer having a first porous sub-layer which is covered with at least one of the sub-layer after the evaporation or the degradation of the material.

Advantageously, the said material is aqueous or a photosensitive resin based on polycarbonate for example Unity 2203 from Promerus.

It is possible to provide a heat treatment step or a controlled pressurization step after the evaporation or the degradation to permit the removal of waste material.

As an alternative or in combination, the anchoring zone may be defined by localized treatment of the substrate and/or the buckling layer suitable for decreasing the adhesion of the buckling layer to the substrate beyond the central zone.

The treatment may be a plasma treatment for increasing the surface roughness.

As an alternative or in combination, the anchoring zone may be defined by localized energy input, across the superimposed substrate and buckling layer even if the said definition is incomplete beyond the central zone.

The present invention also relates to an encapsulated component comprising a substrate, a cover joined to the substrate at the level of at least one anchoring zone bounding a cavity in which the component is located, the cover being a buckled buckling layer.

The buckling layer may be a monolayer or comprises a plurality of stacked sub-layers.

The buckling layer may be structured.

The buckling layer or the sub-layers of the buckling layer may be made from an organic material selected from photosensitive resins such as benzocyclobutene or polyethylene terephthalate, parylene, polydimethylsiloxane, a metallic material selected from titanium, carbon, aluminium or alloys thereof, an inorganic material selected from silicon, silicon germanium, silicon dioxide, silicon nitride, silicon carbide, diamond carbon, titanium nitride.

One or more sub-layers may be in contact with the substrate in the anchoring zone.

The sub-layers of which one side is exposed at least partly to the interior of the cavity may have a getter role, if the cavity is subject to vacuum.

One of the sub-layers of which one side is exposed at least partly to the interior of the cavity may be porous.

The sub-layer which is located on the side of the interior of the cavity may have a role of mechanical uncoupling with the substrate.

One of the sub-layers may have a role of mechanically strengthening the cover.

It is preferable for the substrate to have a thermal expansion coefficient higher than that of the buckling layer or than that of at least one of its sub-layers.

As an alternative, one of the sub-layers of the buckling layer may have a thermal expansion coefficient higher than that of another sub-layer of the buckling layer.

At least one compression element may surmount the periphery of the buckling layer.

The substrate may comprise one or more anchoring points hollowed in the buckling layer.

BRIEF DESCRIPTION OF THE DRAWINGS

The present invention will be better understood from a reading of the description of exemplary embodiments given for information and non-limiting, with reference to the appended drawings in which.

The various alternatives described must be understood as not being mutually exclusive.

Identical, similar or equivalent parts of the various figures described below bear the same numerical references in order to facilitate the passage from one figure to another.

The various parts shown in the figures are not necessarily shown at a uniform scale, in order to make the figures more legible. Similar backgrounds of filling the figures do not always represent the same material.

DETAILED SUMMARY OF PARTICULAR EMBODIMENTS

Figure 1A:
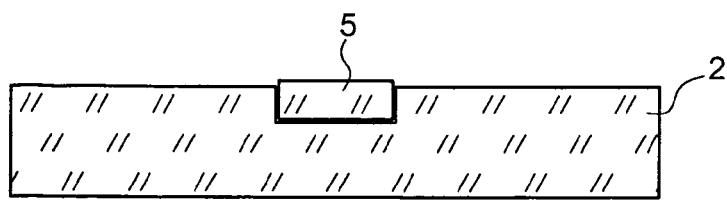
FIGS. 1A to 1C show steps of the preparation of a cover according to a first example of the method of the invention.
Figure 1B:
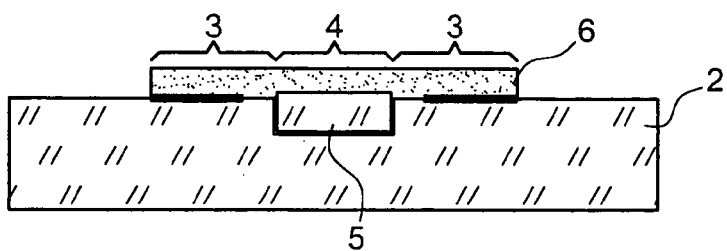
Figure 1C:
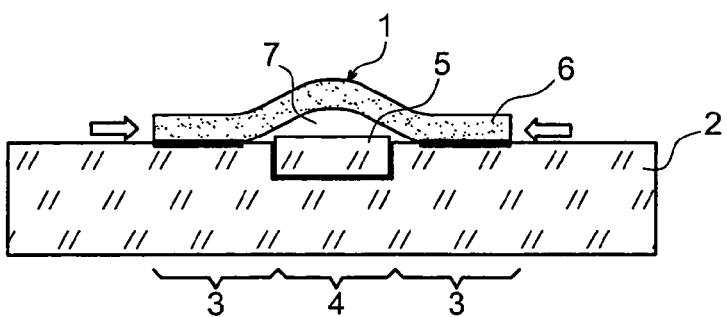
Figure 1D:
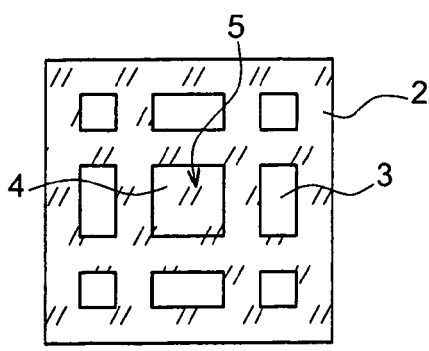
FIGS. 1D and 1E show the anchoring zone on the substrate.
Figure 1E:
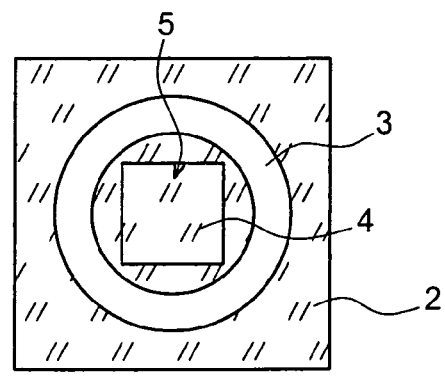

We shall now describe an exemplary embodiment of at least one cover 1 on a substrate 2 on which or in which a component 5 is housed. Reference is made to FIG. 1A. The component 5 may be of the electromechanical or optoelectromechanical system, for example a radiofrequency MEMS, an accelerometer, a bulk acoustic wave filter, an inertial sensor of the accelerometer or gyroscope type. It could obviously be an electronic, optical or optoelectronic component. At least one anchoring zone 3 is defined on the substrate 2, offset from a central zone 4 in which the component 5 is located. Reference is made to FIG. 1B. There may be a plurality of disjointed anchoring zones 3 forming a pattern surrounding the central zone 4 insofar as the cover 1 does not need to be sealed as shown in FIG. 1D. The pattern is square, and there are eight anchoring zones 3. In the opposite case, the anchoring zone 3 may be continuous, as shown in FIG. 1E, where it is in the form of a ring, and surrounds the central zone 4. The shapes given are not limited.

The substrate 2 may be a substrate of a semiconductor material, for example silicon, comprising the component 5 in the central zone 4. In this configuration, the substrate 2 is treated because it contains within itself the component 5 which has been prepared particularly by etching. A buckling layer 6 (FIG. 1B) is formed on the surface of the central zone 4 and of the anchoring zone 3. The buckling layer 6 is buckled, taking care that it is convex while remaining bonded at least partly to the substrate in the anchoring zone 3 in order to obtain the cover 1 bounding a cavity 7 having an adequate volume above the central zone 4 of the substrate 2 (FIG. 1C). If there is a plurality of components on the substrate 2, the procedure is similar with one buckling zone per component as shown in FIG. 8E or a single buckling layer for the entire substrate 2, or even only one of the sub-layers of the buckling layer when the buckling layer is multilayer as shown in FIG. 8F.

The buckling layer 6 may be a monolayer as shown in FIG. 1 or a multilayer as shown in FIG. 2 described below, where a plurality of sub-layers is shown.

The buckling layer 6 or its sub-layers may be prepared of an inorganic material such, for example, silicon, silicon germanium, silicon dioxide whether polycrystalline, microcrystalline or amorphous, silicon nitrite, silicon carbide, diamond carbon, titanium nitrate, a metallic material such as, for example, titanium, copper, aluminium or alloys thereof, an organic such as, for example, a photosensitive resin such as benzocyclobutene BCB, or polyethylene terephthalate PET, poly-para-xylylene or parylene, polydimethylsiloxane PDMS.

The buckling layer 6 may be formed by any known means including: thin film deposition, film lamination, spin definition or spraying for organic deposits of the sol gel type, moulding, eutectic welding. Thin film deposits can be prepared by chemical vapour deposition (CVD) whether conventional, under reduced pressure known as low pressure chemical vapour deposition (LPCVD) or assisted by plasma known as plasma enhanced chemical vapour deposition (PECVD) by physical vapour deposition (PVD), by electrolysis, epitaxy, thermal oxidation, vacuum deposition. As to bonding, mention can be made of molecular bonding such as silicon direct bonding (SDB), eutectic welding, organic bonding, anodic bonding.

FIG. 1B shows a single buckling layer 6 having limited adhesion. This means that at the central zone 4, its adhesion is lower than that possessed at the anchoring zone 3. Its adhesion in the central zone 4 is too low to prevent buckling.

The preparation of the buckling is connected both with the materials used for the buckling layer 6 and the applications intended. The goal is to obtain a cavity 7 around the component 5 on completion of the buckling. The buckling layer 6 therefore can no longer be in contact with the component 5 in order to avoid disturbing its operation. When the component is a microsystem 5 comprising an active part that is movable, it is important to avoid hindering its movement. Similarly, it is important for the buckling layer 6 to leave no waste on the active part of microsystem 5. It is also important for the cover 1 thereby formed to have a mechanical strength adapted to the component 5 and to its use. Furthermore, it may be desirable for the interior of the cavity 7 to be subjected to vacuum or to a controlled atmosphere, and in consequence, the cover 1 must be hermetically sealed.

We shall now discuss multilayer buckling layers 6. In FIGS. 2A to 2D, a cover 1 is prepared from a stack of two buckling sub-layers 6.1, 6.2 which are both in contact with the substrate 2 during the formation and after buckling.

Figure 2A:
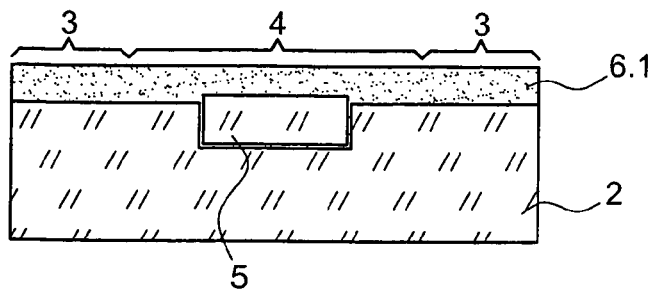
FIGS. 2A to 2D show steps in the preparation of a cover according to a second example of the method of the invention.
Figure 2B:
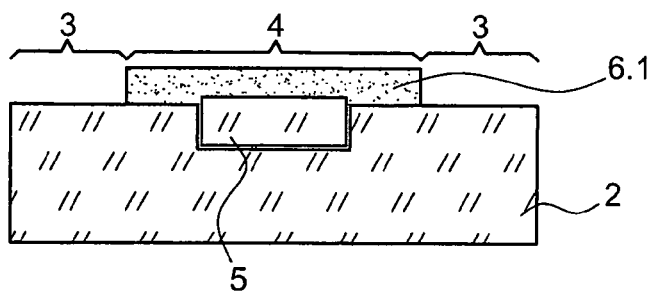

Initially, a first buckling sub-layer 6.1 is deposited on the central zone 4 and the anchoring zone 3 (FIG. 2A). This first sub-layer 6.1 has a first limited adhesion in order to withstand at least one lithography and etching step. The contour of the first buckling sub-layer 6.1 is delimited by photolithography and etching (FIG. 2B) so that it overlaps the central zone 4 but practically does not encroach on the anchoring zone 3. The etching can be carried out by any means known to a person skilled in the art and depends on the nature of the first sub-layer 6.1.

Figure 2C:
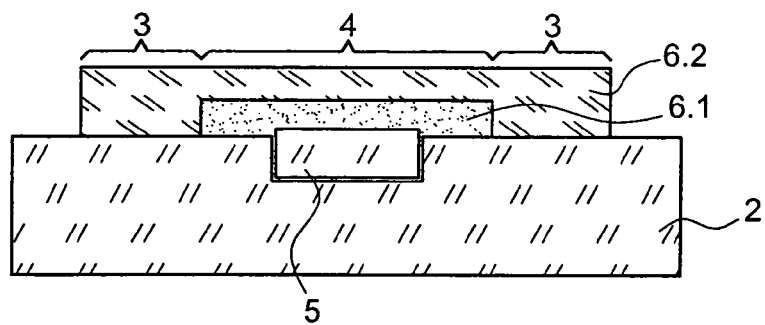

A second sub-layer 6.2 is then deposited on the first sub-layer 6.1 thereby delimited, the second sub-layer 6.2 being prepared from a material with a higher adhesion than that of the material of the first sub-layer 6.1 (FIG. 2C). The second sub-layer 6.2 is in contact with the substrate 2 and the anchoring zone 3, and extends around the first sub-layer 6.1.

The two-layer buckling layer 6 is then caused to buckle (FIG. 2D) until a cavity 7 with an adequate volume is obtained. After buckling, the buckling layer 6 becomes the cover 1.

It is possible for one of the sub-layers of the buckling layer 6, having one of its sides exposed to the interior of the cavity 7, like the first sub-layer 6.1 in FIG. 2, to have a getter role. Alloys based on titanium, zirconium can be used. Such a sub-layer 6.1 is advantageous when the interior of the cavity 7 has to operate under vacuum.

Figure 3A:
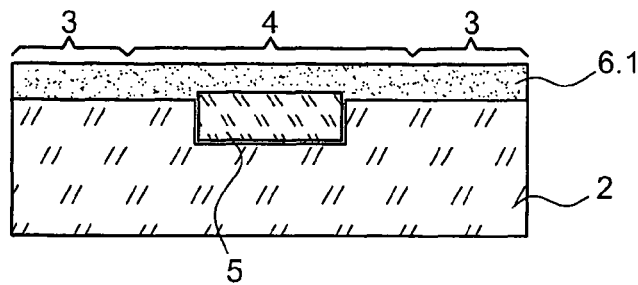
FIGS. 3A to 3D show steps in the preparation of a cover according to a third example of the method of the invention.
Figure 3B:
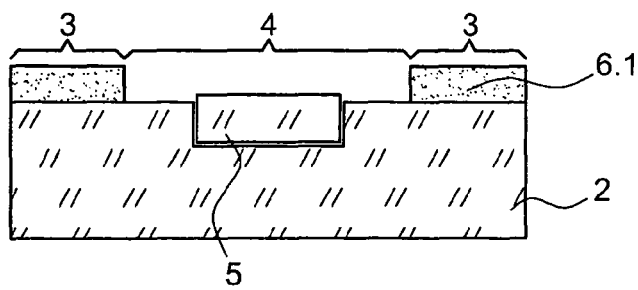
Figure 3C:
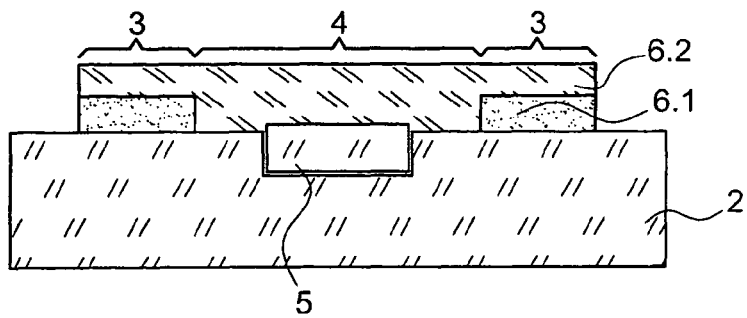
Figure 3D:
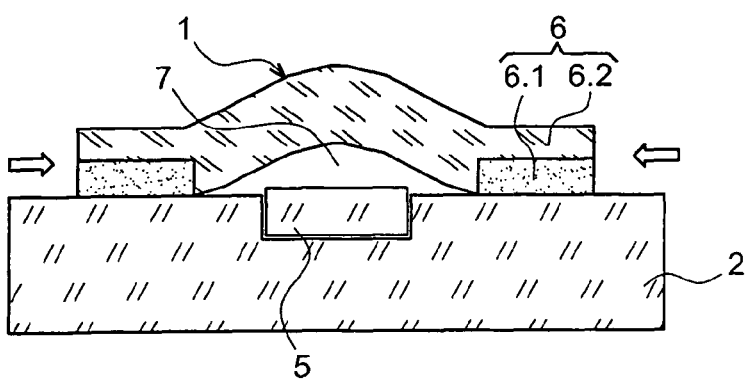

FIGS. 3A to 3D show an alternative cover 1 having two sub-layers 6.1, 6.2. A first sub-layer 6.1 is deposited on the anchoring zone 3 and the central zone 4 of the substrate 2 (FIG. 3A). This first sub-layer 6.1 has a good adhesion to the substrate 2 at the anchoring zone 3. The contour of the first sub-layer 6.1 is delimited by photolithography and etching, so that it is located on the anchoring zone 3 and that it does not encroach on the central zone 4 (FIG. 3B). A second sub-layer 6.2 is deposited on the first sub-layer 6.1 thereby delimited (FIG. 3C). The second sub-layer 6.2 comes into contact with the substrate 2 at the central zone 4. The second sub-layer 6.2 is made from a material having an adhesion lower than that of the material of the first sub-layer 6.1. The buckling layer 6, which is a stack of the two sub-layers 6.1, 6.2 (FIG. 3D) is caused to buckle until a cavity 7 of adequate volume is obtained.

Figure 4A:
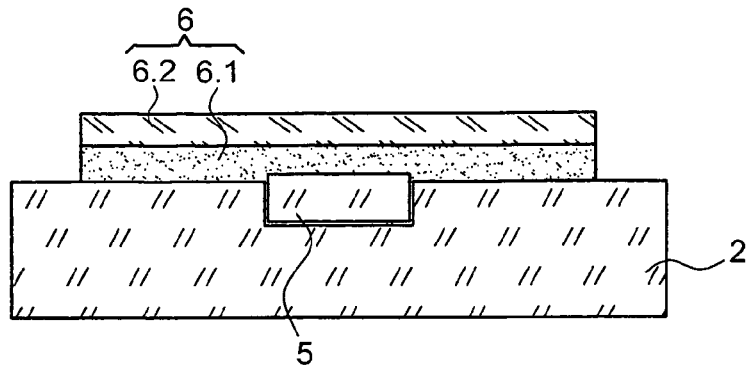
FIGS. 4A and 4B show steps in the preparation of a cover according to a fourth example of the method of the invention.
Figure 4B:
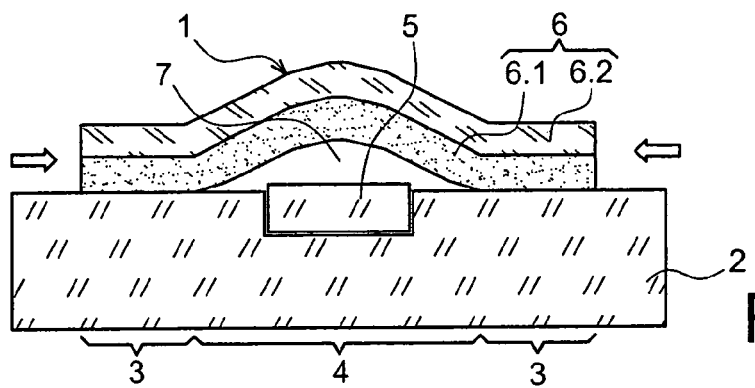

Obviously, it is possible to have only a single sub-layer which is in contact with the substrate 2. Reference is made to FIGS. 4A, 4B in which only two sub-layers 6.1, 6.2 are provided. The first sub-layer 6.1, the second sub-layer 6.2 are deposited in succession, and only the first sub-layer 6.1 comes into contact with the substrate 2 at the level of both the anchoring zone 3 and the central zone 4 (FIG. 4A). The buckling layer 6, which is a stack of the two sub-layers 6.1, 6.2 (FIG. 4B) is then caused to buckle until a cavity 7 of adequate volume is obtained.

It is not necessary for the second sub-layer 6.2 to have adhesion properties as good as those of the first sub-layer 6.1. The goal of this configuration may be to improve the bending strength of the cover 1 or the optimisation of its hermetic seal in the case in which this is necessary.

It is possible for the buckling layer 6 or at least one of the sub-layer 6.1, 6.2 when the buckling layer 6 has a plurality of sub-layers to be structured. The structuring is a formatting of the buckling layer or of one of its sub-layers before or after the deposition of the layer in question on the substrate equipped with the microsystem. This formatting consists in modifying an initial sub-layer having a constant thickness and substantially parallel sides into a sub-layer of variable thickness and/or having non-parallel sides. The term structuring implies a specific operation on the initial sub-layer and is not connected to the effect induced by the topology of the substrate comprising the host microsystem. It is pointed out that in FIGS. 2A to 2D, the sub-layer 6.2 that is formed is not structured.

Figure 5A:
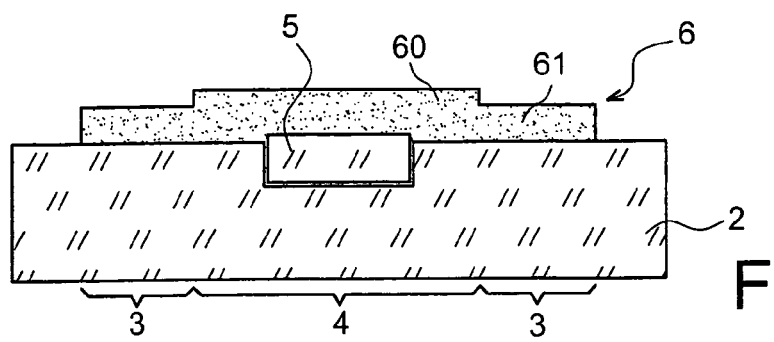
FIGS. 5A to 5D show steps in the preparation of a cover according to a fifth and sixth example of the method of the invention.
Figure 5B:
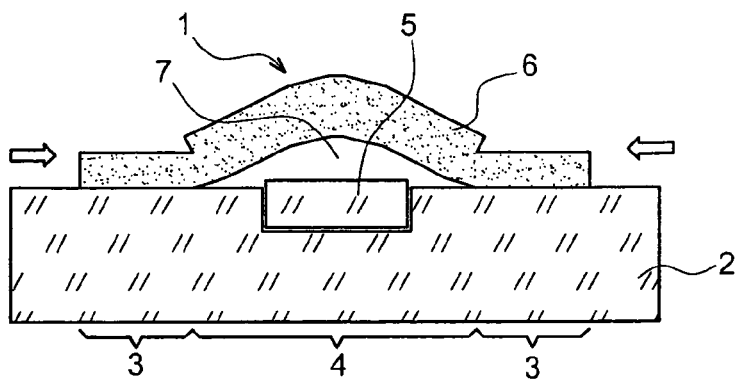

The structuring can be carried out before or after the buckling step. The structuring may be carried out from one or another of the main sides of the buckling layer 6. In FIGS. 5A, 5B, the thickest zone 60 of the buckling layer 6 is located above the component 5 in the central zone 4, and the thinner zone 61 is located at the anchoring zone 3. The difference in thickness resulting from the structuring operation has been obtained from the side of the buckling layer 6 opposite the substrate 2, for example by a hot embossing method. In FIG. 5B, the structured cover 1 is prepared.

Figure 5C:
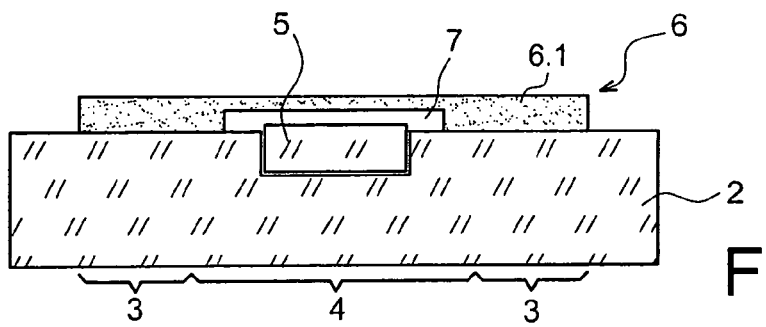
Figure 5D:
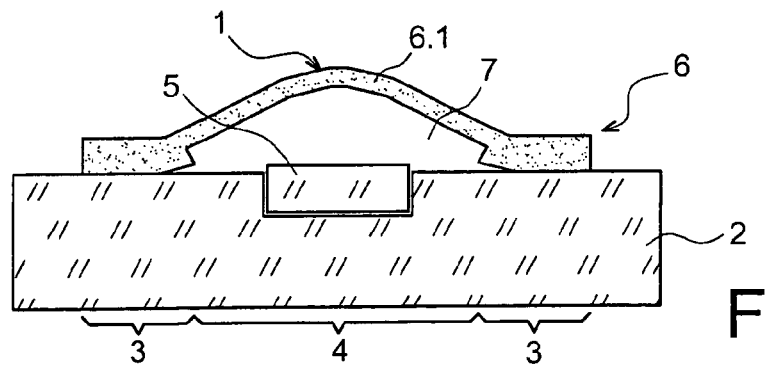

In FIGS. 5C, 5D, the thinner zone 61 of the buckling layer 6 is located above the component 5 in the central zone 4, the thicker zone 60 is located at the anchoring zone 3. The difference in thickness has been obtained from the side of the buckling layer 6 located on the side of the substrate 2. In FIG. 5D, the structured cover 1 is prepared.

Figure 6A:
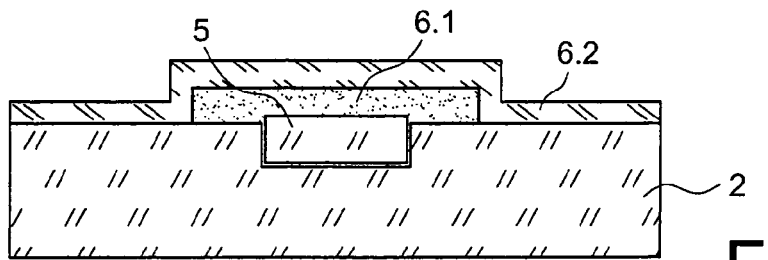
FIGS. 6A to 6F show steps in the preparation of a cover according to a seventh, eighth and ninth example of the method of the invention.
Figure 6B:
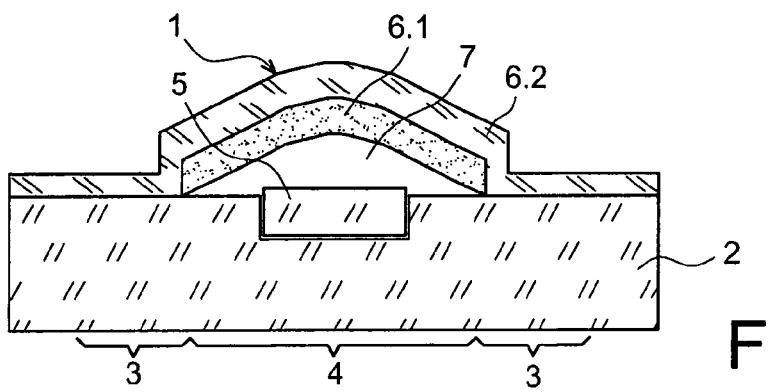
Figure 6C:
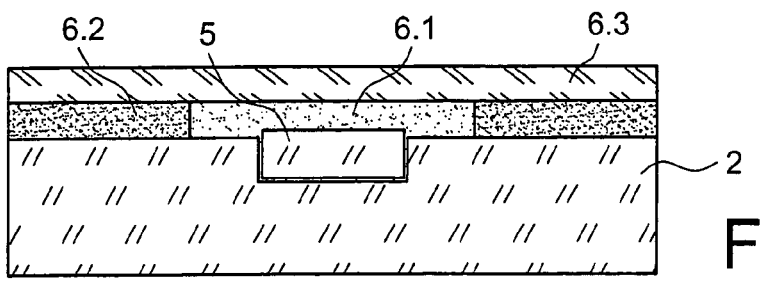
Figure 6D:
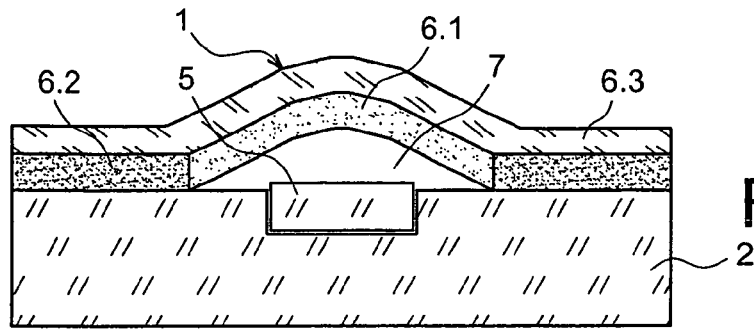

Based on the four configurations shown in FIGS. 2 to 5, combinations can be produced as shown in FIGS. 6A to 6F. In FIGS. 6A, 6B, the buckling layer 6 comprises two sub-layers 6.1, 6.2 of which one sub-layer 6.2, the furthest from the substrate 2 at the central zone 4, is in contact with the substrate 2 at the anchoring zone 3. In FIGS. 6C, 6D, there are three sub-layers 6.1, 6.2, 6.3, which two on the side of the substrate 2, are adjacent instead of being superimposed, one (reference 6.2) being at the level of the anchoring zone 3, and the other (reference 6.1) being at the level of the central zone 4. The third sub-layer 6.3 the furthest from the substrate 2, extends on the first two sub-layers 6.1, 6.2.

Figure 6E:
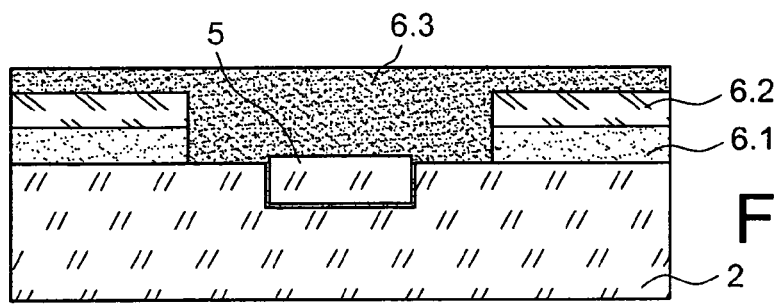
Figure 6F:
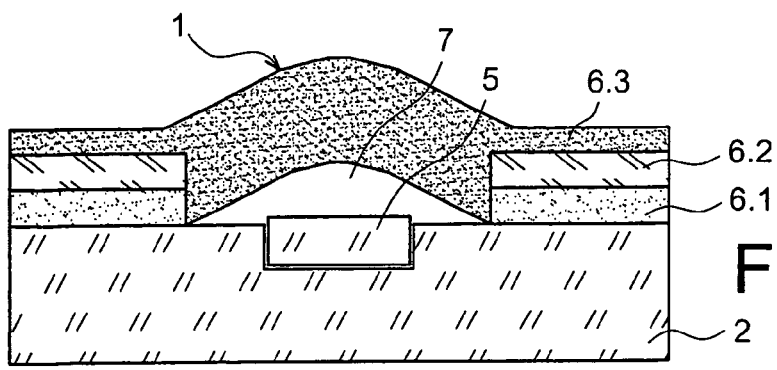

In FIGS. 6E, 6F, there are three sub-layers 6.1, 6.2, 6.3, all superimposed, at the anchoring zone 3. The first two sub-layers 6.1, 6.2 only extend to the level of the anchoring zone 3. The first sub-layer 6.1 is closer to the substrate 2 than the second sub-layer 6.2. At the central zone 4, only the third sub-layer 6.3 is present. The third sub-layer 6.3 is thus superimposed on the first sub-layer 6.1 and on the second sub-layer 6.2 at the anchoring zone 3. The thickness of the buckling layer 6 is substantially constant.

A three-layer configuration of different materials is advantageous because the adhesion of the material of one of the sub-layers to that of at least one of the other sub-layers can be adjusted. Obviously, a surface treatment can be provided on one of the sub-layers or on part of one of the sub-layers in order to modify the adhesion of another sub-layer which overlaps it totally or partially.

For example, in FIGS. 6E and 6F, it is possible for the intermediate sub-layer 6.2 to have a good adhesion with the first sub-layer 6.1 and for the third sub-layer 6.3 also to have a good adhesion to the intermediate sub-layer 6.2. In its absence, the adhesion between the first sub-layer 6.1 and the third sub-layer 6.2 would not have been sufficient.

In FIGS. 6C, 6D, the second sub-layer 6.2 may have a role of reinforcing the adhesion that the third sub-layer 6.3 would have to the substrate 2, whereas the first sub-layer 6.1 may have a role of reinforcing the mechanical strength of the cover 1 to the strength that the cover 1 would have if it were made of the third sub-layer 6.3 alone. Thus all the sub-layers do not necessarily have a role of enhancing the mechanical strength of the cover 1.

The sub-layers having a role to perform on the mechanical strength of the cover 1 will have thicknesses of between a few microns and a few tens of microns for materials of inorganic or metallic origin. The thickness of these sub-layers is conditioned by the rates of deposition and etching. An etching step is generally provided in the cover 1 for access to electrical contact studs 21 associated with the component 5 as shown in FIG. 10C.

The sub-layers of organic material of which the role is decisive for the mechanical sector of the cover 1, may have thicknesses of between a few microns and a few hundred microns. If the sub-layer has a role to perform on the adhesion of the buckling layer and not a mechanical role, as for example the second sub-layer 6.2 is FIGS. 6E and 6F, its thickness may be less than one micron regardless of its type.

We shall now show how to buckle the buckling layer 6. For the buckling to take place, the buckling layer 6 must be maintained under local stress. This stress may be a compression. The buckling can be obtained by heat treatment. The stress can be induced by the substrate 2 itself.

If the buckling layer 6 is a monolayer, it is arranged for it to have a thermal expansion coefficient that is lower than the thermal expansion coefficient of the substrate 2, or if it is a multilayer, for it to comprise at least one sub-layer 6.2 having a thermal expansion coefficient that is lower than the thermal expansion coefficient of the substrate 2. On the contrary, if there is a single sub-layer, it will have a higher thickness than that of the rest of the buckling layer 6. This means that its thickness and its Young's modulus will be higher than those of the rest of the buckling layer 6. Preferably, the sub-layer with a low thermal expansion coefficient is deposited first. It is possible to provide a sub-layer having a function of decreasing the adhesion in the central zone 4.

For a monolayer buckling layer, the lower its stiffness, the lower its strength.

The buckling may take place during the deposition of the buckling layer or of the sub-layer, insofar as the deposition is carried out at an appropriate temperature.

Three alternatives are available with sub-layers. The buckling may take place during the deposition of the sub-layer with a low thermal expansion coefficient, if it is sufficiently under compression with regard to the adhesion of the central zone 4. The buckling may take place during the deposition of another sub-layer having a higher thermal expansion coefficient, the compressive strength then increasing in the sub-layer with a lower thermal expansion coefficient. The buckling may take place after the deposition of the buckling layer by carrying out a vacuum heat treatment, for example at about 300° C. for about 10 minutes. This is a case in which the degradation of the sub-layer deposited first is partial. The said sub-layer remains bound to the buckling layer. During the heat treatment, it is degasified. A pressure is generated and since the assembly is maintained under vacuum, blisters are formed at the interface between the buckling layer and the substrate in the central zone 4, thereby favouring the detachment of the buckling layer.

As an alternative, it is possible for the degradation of the sub-layer deposited first to be complete by evaporation at a temperature lower than about 100° C. for example for a liquid sub-layer of water, propylene carbonate, or a solid sub-layer of Unitic.

The stress level is given by the following formula:

$\sigma = E \cdot \Delta T \cdot \Delta \alpha$ where $\sigma$=stress in the layer or the sub-layer, $\Delta T$=difference in temperature between the temperature of deposition of the layer or of the sub-layer and the ambient temperature and $\Delta \alpha$=difference between the thermal expansion coefficient of the substrate and the thermal expansion coefficient of the layer or of the sub-layer. The temperature of deposition of the sub-layer with a low thermal expansion coefficient must be optimised not only to obtain a desired deposition quality but also to initiate the buckling process by procuring the requisite stress level. For example, with reference to FIG. 5D, the buckling layer 6 can be made from silicon dioxide $SiO_2$ and the substrate 2 can be made of silicon. The thermal expansion coefficient of silicon dioxide is about $0.5 \times 10^{-6}$ mm/K and that of silicon is about $2.6 \times 10^{-6}$ mm/K.

Figure 2D:
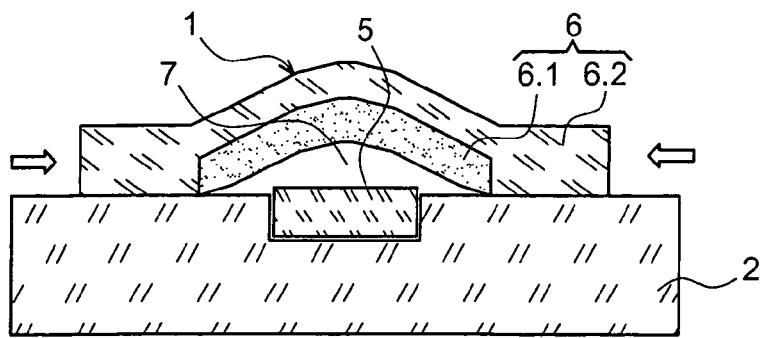

As in other example, with reference to FIG. 2D, the buckling layer 6 may be formed from a first sub-layer 6.1 of parylene surmounted by a second sub-layer 6.2 of silicon dioxide, whereas the substrate 2 is made from silicon. The first sub-layer 6.1 is designed to guarantee the difference in adhesion desired particularly at the central zone 4 and the second sub-layer 6.2 has a mechanical role, it is the layer that adheres to the substrate 2 and in addition, it contributes to initiating the buckling process because of its thermal expansion coefficient which is lower than of the substrate 2.

As an alternative, it is possible for the compressive strength to be induced in the buckling layer 6 instead of in the substrate 2. In this configuration, the buckling layer 6 is a multilayer and comprises at least one sub-layer having a thermal expansion coefficient higher than that of another sub-layer of the buckling layer.

Figure 7A:
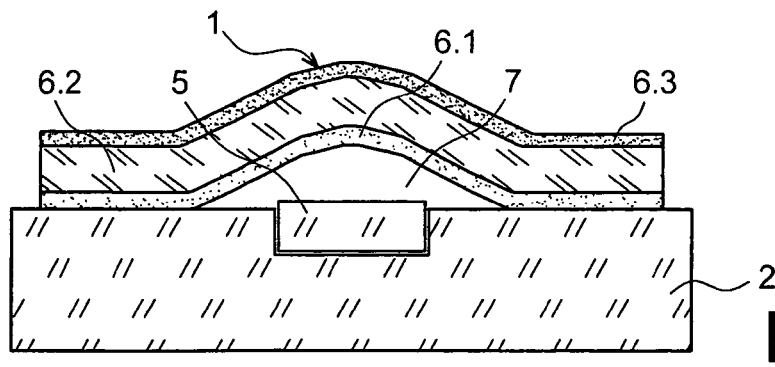
FIGS. 7A and 7B show two novel examples of an encapsulated component according to the invention.

In the example shown in FIG. 7A, the buckling layer 6 is triple-layered with, from the substrate 2, a first sub-layer 6.1 of organic material, designed to provide a mechanical uncoupling between the substrate 2 and the buckling layer 6, a second intermediate sub-layer 6.2 having a thermal expansion coefficient and a third sub-layer 6.3 having a thermal expansion coefficient higher than that of the second sub-layer 6.2. Only the first sub-layer 6.1 is in contact with the substrate 2. It is selected for its adhesion properties. The larger the contact area in the anchoring zone 3, the lower the risk of leakage.

The first sub-layer 6.1 may, for example, be made from parylene, benzocyclobutene, polyethylene terephthalate. The second sub-layer 6.2 may be made from silicon dioxide and the third sub-layer 6.3 from titanium nitride TiN, silicon nitride $Si_3N_4$, copper Cu. The thermal expansion coefficients of the said three metallic or inorganic materials are higher than that of silicon dioxide. The compression is essentially provided by the third sub-layer 6.3, the first sub-layer 6.1 providing a mechanical uncoupling with the substrate 2.

Figure 7B:
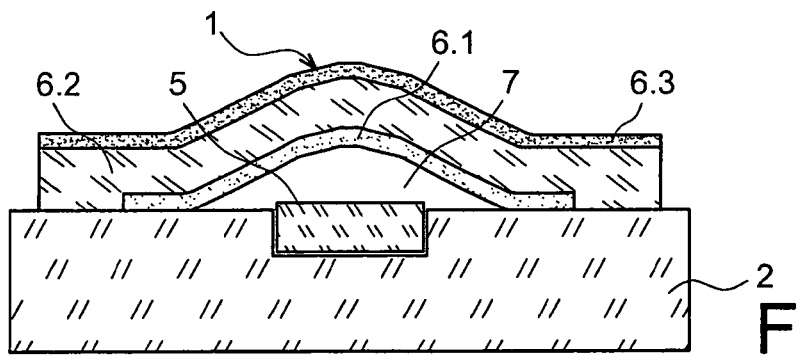

As an alternative, the compressive strength may be provided by an addition of the stress induced by the substrate 2 and the stress induced by one of the sub-layers after its deposition. Reference can be made to FIG. 7B. The first buckling sub-layer 6.1 made from organic materials, configured as shown in FIG. 2D, has the role of guaranteeing a desired difference in adhesion particularly at the central zone 4.

The second sub-layer 6.2 is in direct contact with the substrate 2 beyond the first sub-layer 6.1. It is of the same type as that shown in FIG. 7A. The third sub-layer 6.3, of the same type as that shown in FIG. 7A, has a thermal expansion coefficient higher than that of the second sub-layer 6.2.

According to another embodiment, the buckling can be obtained on the one hand by the use of at least one additional compression element 8 to apply the stress and, on the other, by heat treatment to cause the buckling. The compression element 8 is located at the periphery of the buckling layer 6 at the anchoring zone 3. The compression element 8 surmounts the buckling layer 6 and optionally encroaches on the substrate 2 around the buckling layer 6. When there is a plurality of compression elements 8, they form a discontinuous ring along the edge of the buckling layer 6. When there is a continuous ring and hence a single compression element 8, it is the compression element 8 that provides the seal.

The thermal expansion coefficient of the compression element 8 is adapted to that of the buckling layer 6 and optionally to that of the substrate 2 insofar as the compression element 8 surmounts the substrate 2. The type of compression element 8 determines the mechanical coupling between the said element and the buckling layer 6 and/or the substrate 2. The compression element 8 is obtained by deposition, the deposition temperature being decisive insofar as it is directly connected to the stress level to be induced on the buckling layer 6. The higher the temperature, the higher the stress, all other things remaining equal.

Figure 8A:
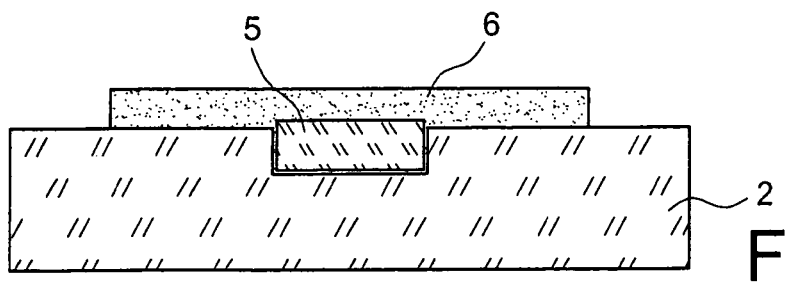
FIGS. 8A to 8C show steps of the preparation of a cover according to a novel example of the method of the invention and FIGS. 8D to 8F also show three novel examples of an encapsulated component according to the invention.
Figure 8B:
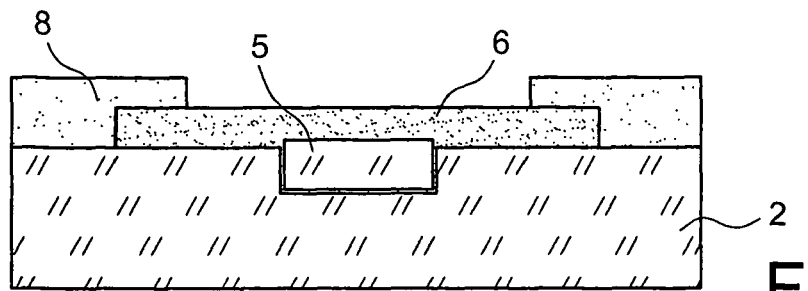
Figure 8C:
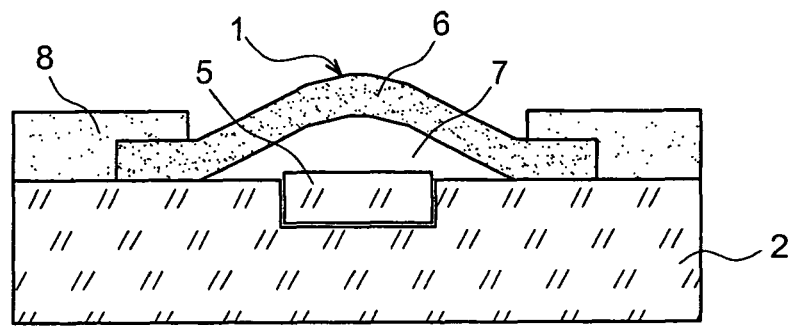

Reference can now be made to FIGS. 8A to 8C. In FIG. 8A, only the buckling layer 6 is deposited. It is assumed that it is a monolayer and, for example, made from silicon dioxide. The substrate 2 is, for example, made from silicon. After deposition of the buckling layer 6, the said layer is naturally under compression because its thermal expansion coefficient is lower than that of the substrate 2.

To increase the compression, a compression element 8 is deposited at the periphery of the buckling layer 6, the compression element in the example extending both on the buckling layer 6 and on the substrate 2 (FIG. 8B). The material of the compression element 8 will have a stiffness higher than that of the buckling layer 6 and a thermal expansion coefficient also higher than that of the buckling layer 6 or that of at least one of the sub-layers of the buckling layer if the buckling layer is a multilayer. Advantageously, the material of the compression element will have a thermal expansion coefficient higher than that of most of the sub-layers of the buckling layer. In fact, it is difficult to prepare a multilayer buckling layer of which all the sub-layers have a thermal expansion coefficient lower than that of the compression element. Advantageously, the thermal expansion coefficient of the compression element will be higher than that of the stiffest sub-layer.

An optimisation of the geometry of the compression element 8 can be obtained, the geometry depending on the geometry of the buckling layer 6, on that of the anchoring zone 3 and on the desired stress level.

By a subsequent heat treatment, the buckling layer is caused to buckle (FIG. 8C), and the buckling is maintained under compression by the compression element 8 and by the substrate 2. In this case, the buckling is not obtained during the formation of the buckling layer but after, during the deposition of the compression element 8, the said deposition taking place at high temperature.

The compression element 8 may be prepared from an inorganic material such as silicon nitride $Si_3N_4$ (Young's modulus 310 GPa and thermal expansion coefficient $3.4 \times 10^{-6}$ mm/K) or even better, titanium nitride TiN (Young's modulus 600 GPa and thermal expansion coefficient $9.4 \times 10^{-6}$ mm/K). A metallic material may also be employed such as copper Cu which has an even higher thermal expansion coefficient (Young's modulus 130 GPa and thermal expansion coefficient $17 \times 10^{-6}$ mm/K). The lower surface of the copper may be offset by increasing the thickness of the compression element 8.

Figure 8D:
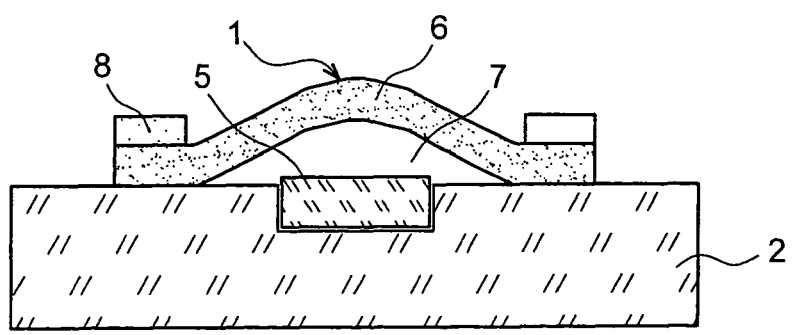
Figure 8E:
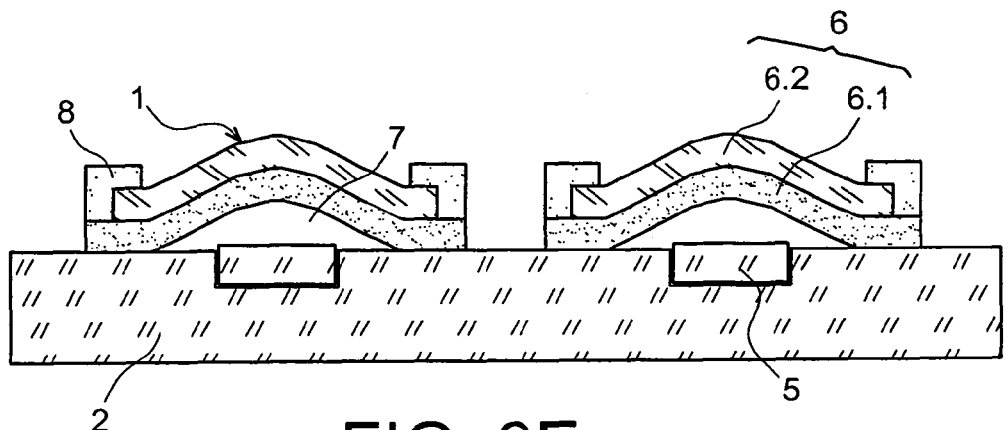
Figure 8F:
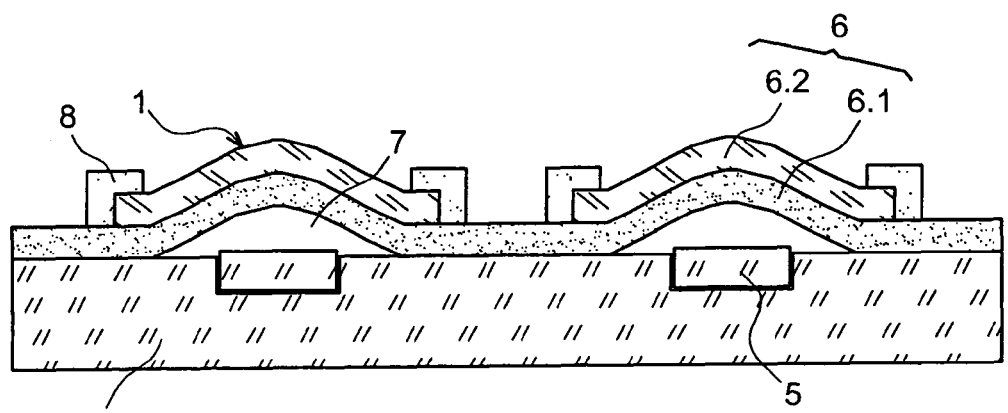

FIG. 8D shows an example of the compression element 8 which does not encroach on the substrate 2. It is assumed that it is made from titanium nitride TiN. It is located at the periphery of the buckling layer 6.

FIG. 8E shows a two-layer buckling layer 6 with a first sub-layer 6.1 surmounted by a second buckling sub-layer 6.2. The first sub-layer 6.1 is made from an organic material which provides a difference in adhesion required between the substrate 2 and the rest of the buckling layer 6. This first buckling sub-layer 6.1 provides a mechanical uncoupling between the substrate 2 and the buckling layer 6. It has a low Young's modulus compared with that of the second buckling sub-layer 6.2 and a thickness of a few microns. It may, for example, be made from parylene, benzocyclobutene, polyethylene terephthalate. The mechanical strength of the buckling layer 6 is provided by the second buckling sub-layer 6.2 which is stiffer and whose thermal expansion coefficient is low compared to that of the substrate 2.

The compression element 8 meets the same requirements as stated in the preceding example: if the thermal expansion coefficient is higher at least than that of the second sub-layer 6.2 and its Young's modulus is higher than those of the first and second sub-layers 6.1, 6.2. The first sub-layer 6.1 extends beyond the second sub-layer 6.2 and the compression element 8 extends at the periphery of the buckling, layer 6 both on the first and the second sub-layers 6.1, 6.2 but not on the substrate 2.

FIG. 8F shows an embodiment in which at least one sub-layer 6.1 of the buckling layer 6 extends on several microsystems 5.

Figure 9A:
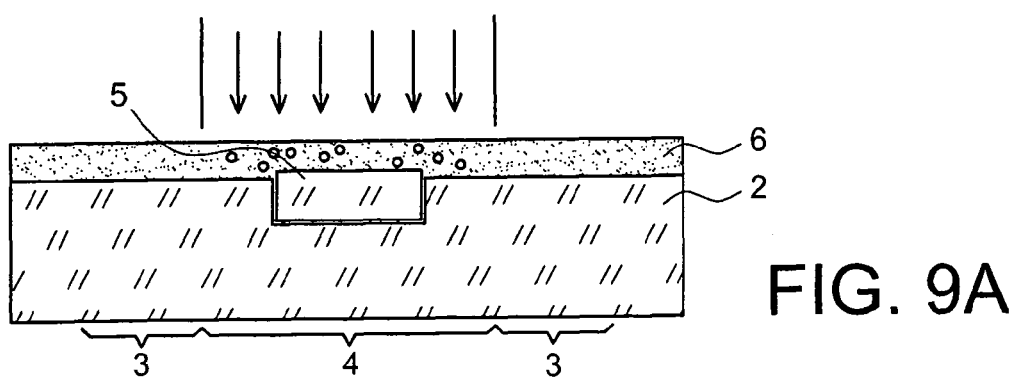
FIGS. 9A to 9C show an example of the buckling layer by ion implantation.
Figure 9B:
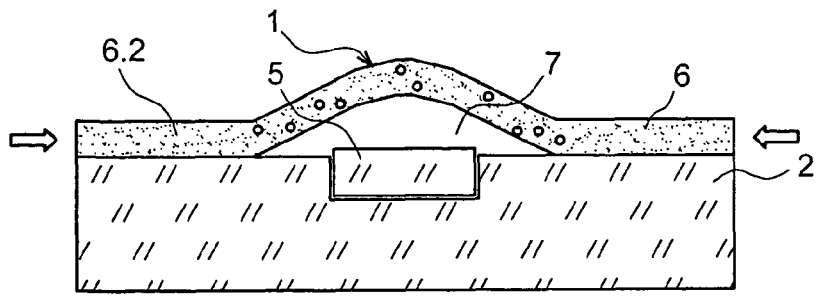

According to a further embodiment, the buckling can be obtained by localized ion implantation in the buckling layer 6. Reference can be made to FIGS. 9A, 9B. The ion implantation takes place at the central zone 4 and the anchoring zone 3 is left untouched. The ions implanted in the buckling layer 6 induce an internal compressive stress in the said buckling layer 6. This compressive stress causes the buckling. Reference can be made to the article called "Crack-arresting compression layers produced by ion implantation", V. N. Gurarie et al., Nuclear Instruments And Methods In Physics Research, B242 (2006), pages 421-423. The value of the compressive stress depends on the dose implanted and the types of ion used. FIG. 9B shows the buckling layer 6 after buckling. An optional heat treatment can be carried out to promote the buckling of the buckling layer 6 at a temperature of about 200° C. to activate the buckling mechanism.

Let us consider the case in which the thermal expansion coefficient of the buckling layer 6 is higher than the thermal expansion coefficient of the substrate 2. After the deposition of the buckling layer 6, the said layer is naturally in tension. To activate the buckling, the said compression layer must be placed under compression. The activation mode necessarily cannot be thermal. If an ion implantation method is used, the dose and the elements to be implanted are selected to counteract the tension existing in the buckling layer after the deposition, in order to place it under compression beyond the critical buckling stress. Advantageously, a person skilled in the art will select the species to be implanted with regard to its weight, its type (anion or cation) so that its position in the crystal lattice of the buckling is such as to induce a maximum compressive stress. By successive tests, a person skilled in the art will adopt a dose that serves to reach the critical compressive stress.

Advantageously, the buckling layer 6 may be made from ceramic, such as silicon nitride $Si_3N_4$ or alumina $Al_2O_3$.

A single ion implantation step serves to obtain the buckling. When the buckling has been obtained by ion implantation and additional heat treatments are required, for example during the plastic injection for coating the cover, the buckling layer has an improved mechanical strength compared to the cases in which the buckling is not obtained by ion implantation. In fact, during a subsequent temperature ramp up, the buckling layer 6 having a thermal expansion coefficient higher than that of the substrate 2, the internal compression increases and the bending strength is thereby improved.

Let us now consider the case in which the thermal expansion coefficient of the buckling layer 6 is lower than the thermal expansion coefficient of the substrate 2. It may be made from silicon dioxide or polycrystalline silicon.

After the deposition of the buckling layer, the said layer is naturally under compression and is likely to already have an internal stress higher than the critical buckling stress if the deposition temperature is sufficient. If, however, the effect of the deposition is insufficient, a further activation of the buckling can be provided by ion implantation or plasma hardening.

Furthermore, the device obtained may then be subjected to assembly steps employing methods involving temperatures above about 100° C. In order to maintain the mechanical stiffness of the cover, it is advantageous to first prepare a layer suitable for preserving or increasing the stiffness of the cover 1.

Figure 9C:
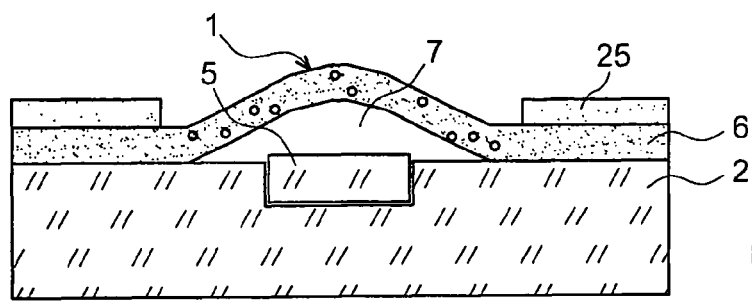

For this purpose, after buckling, an additional coating 25 of a material with a low thermal expansion coefficient, such as silicon dioxide $SiO_2$ or polycrystalline silicon, is deposited on the buckling layer 6. It may be located only at the periphery of the buckling layer 6 (FIG. 9C) and assume the shape of a ring, or extend over the entire buckling layer 6. The deposition of this additional coating 25 must not have an impact on the buckling carried out, but it is designed to accentuate or preserve the compressive strength in the buckling layer 6 during a subsequent heat treatment at a temperature above about 100° C.

As an alternative, the buckling can be carried out by deposition of the buckling layer or of at least one sub-layer of the buckling layer by epitaxial stress deposition. For example, the layer or the sub-layer deposited by epitaxy may be made from silicon-germanium and the substrate or the host sub-layer may be of silicon.

A further alternative consists in subjecting the buckling layer or one of its sub-layers to a plasma hardening. These steps cannot be shown specifically. A number of figures represent the buckling and it is assumed that these means for obtaining the buckling are shown in these figures.

The modes for compressing the buckling layer that have just been described (ion implantation, plasma hardening as well as epitaxial stress deposition) may also be applied to the compression elements 8 to reinforce the compression. Furthermore, a heat treatment can be coupled with the compression modes. The compression elements 8 may be multilayer with materials having different expansion coefficients.

We shall now consider the anchoring zone 3. The anchoring zone 3 serves to contain the buckling. Its geometry must be reproducible. It must preserve its properties, over time, so that the anchoring of the cover 1 to the substrate 2 does not deteriorate. It may also contribute to ensuring the tightness of the cover 1.

The anchoring may be defined by the adhesion of the substrate 2 to a material of the buckling layer 6 which comes into contact with the substrate 2. Reference can be made to the description of the FIG. 2. However, it is possible to define the anchoring zone 3 prior to the formation of the buckling layer 6. A higher adhesion is sought at this anchoring zone 3 than at the central zone 4.

Figure 10A:
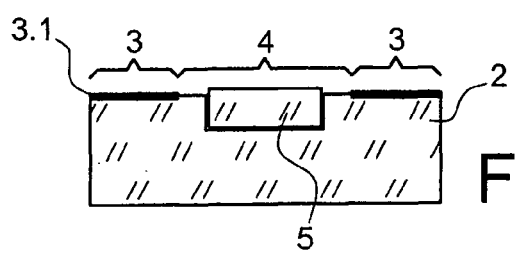
FIGS. 10A to 10F show examples of deposition for defining the anchoring zone.
Figure 10B:
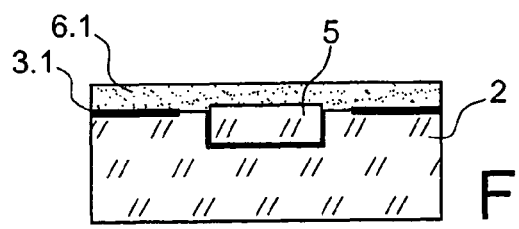
Figure 10C:
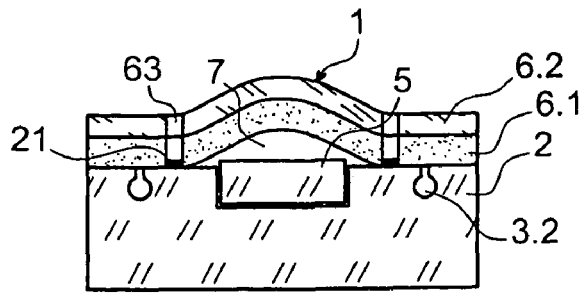

A treatment or a deposition 3.1 can thus be carried out on the anchoring zone 3 in order to improve the adhesion of the buckling layer 6 to the substrate 2 as shown in FIG. 10A. This deposition may be an adhesive deposit before lamination of a film 6.1 forming a sub-layer of the buckling layer or the buckling layer (FIG. 10B). The film 6.1 may also be formed of a stack of sub-films joined by adhesive or by direct adhesion during the deposition of the upper sub-film or films, if the material permits this by appropriately adjusting the deposition pressure and temperature.

As an alternative, after the adhesive deposition, another substrate may be added as seen subsequently, said substrate being capable of being subsequently thinned.

Instead, of using an adhesive deposition, it is possible to deposit an appropriate adhesion primer on the buckling layer or on the first sub-layer of the buckling layer to be bonded, in the case in which the said buckling layer is organic.

This procedure is suitable for a first mechanical uncoupling sub-layer, like the one referenced 6.1 in FIG. 7A. A completely organic buckling layer is unsuitable due to its poor mechanical properties.

As an alternative, instead of bonding the buckling layer 6 to the substrate 2, it is possible to weld it by eutectic welding, by anodic bonding, FIG. 10B also possibly representing this alternative, so as to avoid needlessly increasing the number of figures.

Two substrates 2, 20 of silicon can thereby be assembled, one of which provides the buckling layer and the other the substrate. The eutectic mixture 3.1 is deposited on the anchoring zone 3 of the first substrate 2 or on the second substrate 20. It may be recalled that a eutectic is a mixture of substances of which the melting point is considerably lower than the melting point of the substances constituting the mixture. Examples of eutectic welding are gold silicon AuSi mixtures or gold tin AuSn mixtures.

One example of the treatment to be applied to the anchoring zone 3 for improving the adhesion of the buckling layer is, for example, to apply an oxygen plasma to an organic substrate before applying an organic buckling layer or buckling sub-layer. This procures both a slight surface roughness and a surface chemistry preparation.

It is also possible, at the anchoring zone 3, to provide hollow anchoring points 3.2 in the substrate 2. Reference can be made to FIG. 10C on the one hand, and, on the other, to the article "Robust parylene-to-silicon mechanical anchoring" LIGER Matthieu et al, the 16th IEEE International MEMS Conference (MEMS'03), Kyoto, Japan, 19-23 Jan. 2003, pages 602-605. The hollow anchoring points 3.2 may be wells, trenches. They are obtained by etching the substrate 2. The material of the buckling layer or of a buckling sub-layer 6.1 is deposited, fills the wells or the trenches 3.2, and is thereby anchored to the substrate 2. FIG. 10C also shows the preparation in the buckling layer 6 of openings 63 for providing access to electrical contact studs 21, carried by the substrate 2, designed to supply power to the component 5.

Means have been described for promoting the anchoring between the substrate 2 and the buckling layer 6 by improving the adhesion at the anchoring zone 3.

As an alternative or in addition, it is possible to decrease the adhesion between the buckling layer 6 and the substrate 2 at the central zone 4.

Figure 10D:
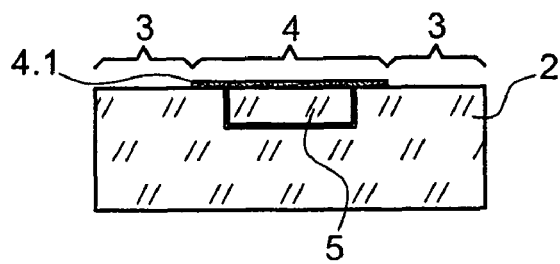

This can be done by a treatment or a deposition on the central zone 4 in order to decrease the adhesion of the buckling layer 6 to the substrate 2 as shown in FIG. 10D before the deposition of the buckling layer 6. It is possible to deposit an intermediate material 4.1 locally on the substrate 2 at the central zone 4 before the deposition of the buckling layer 6. As an alternative, it is the buckling layer 6 which can receive the intermediate deposit so that the said deposit is located at the central zone 4 after assembly of the substrate 2. The buckling layer 6 is then not in direct contact with the component 5. Once the buckling layer is deposited or partially deposited or assembled, the intermediate material 4.1 is evaporated or deteriorated in order to release the buckling layer 6. The material of the intermediate layer 4.1 may be selected from liquid materials based on water or from polymers such as, for example, Unity 2203, which is a photosensitive resin based on polycarbonate from Promerus, and thiols. It can be removed thermally. Care is taken to avoid any waste that is liable to disturb the operation of the component 5.

Figure 10E:
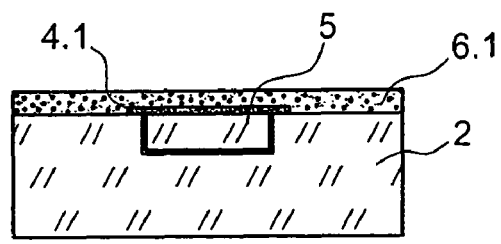
Figure 10F:
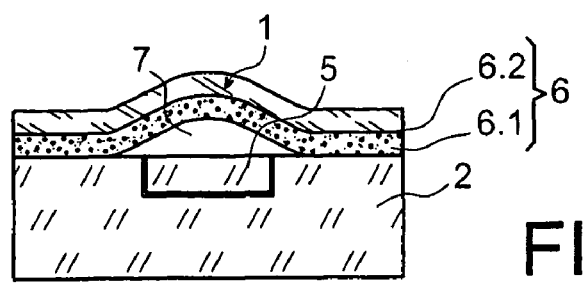

For this purpose, the waste produced by the thermal degradation or evaporation is removed by using a first porous buckling sub-layer 6.1 as shown in FIG. 10E. After evaporation or degradation, at least one other sub-layer 6.2 is deposited as shown in FIG. 10F to complete the buckling layer 6.

After the evaporation or degradation step, a new step may be provided of heat treatment or controlled pressurization lower than about 10 Pa ($10^{-1}$ mbar), typically about 0.01 Pa ($10^{-4}$ mbar), to permit the removal of the largest wastes. The heat treatment step may be carried out at a temperature above about 100° C. and advantageously between about 100° C. and 400° C.

Use can also be made of a material that is non-adhesive or slightly adhesive, which forms a sub-layer of the buckling layer, such as polytetrafluoroethylene, silicones, parylene, polydimethylsiloxane, photosensitive resins.

As a treatment for decreasing the adhesion of the central zone 4, it is possible to increase the roughness of the central zone 4 by a plasma treatment of the substrate 2.

For an organic substrate, an oxygen plasma can promote and prepare the surface for organic bonding with adhesive addition. In this case, a slight surface roughness is generated and the surface chemistry is prepared.

Figure 11A:
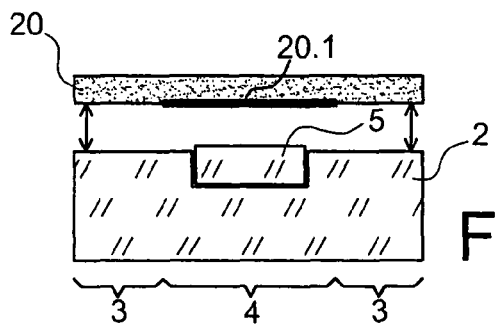
FIGS. 11A to 11D show examples of treatment for defining the anchoring zone.

For a silicon substrate designed to undergo molecular bonding, a more powerful plasma of the argon or $SF_6$ type can be used in the central zone 4. As an alternative, it is possible to treat the buckling layer 6 by plasma insofar as it issues from a second substrate 20, of silicon like the first one referenced 2, which is then assembled by molecular bonding with the first substrate 2 at the anchoring zone 3. Reference can be made to FIG. 11A. The second substrate 20 is treated by plasma to make it rough only at a zone 20.1 which faces the central zone 4 of the first substrate 2. No treatment is applied to the part which faces the anchoring zone 3. If the second substrate 20 is assembled by molecular bonding to the first substrate 2 at the anchoring zone 3, the surfaces to be assembled must be prepared but must not be too rough, because otherwise, adhesion may not take place.

Figure 11B:
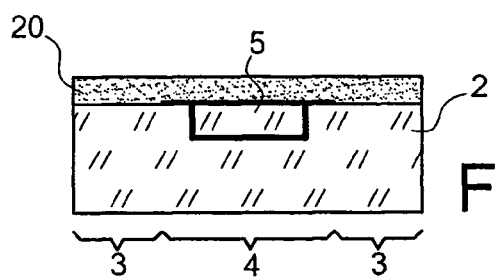
Figure 11C:
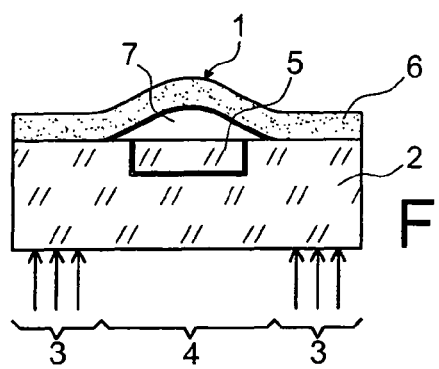

A heat treatment may be provided to reinforce the assembly by bonding and a step of thinning of the second substrate 20 as shown in FIG. 11B. The second substrate 20, after thinning, becomes the buckling layer 6 which is then buckled (FIG. 11C). The natural roughness of the two substrates 2, 20 favours the molecular bonding at the anchoring zone 3 during assembly. On the contrary, the higher roughness of the second substrate 20 at the zone 20.1 (or of the first substrate 2) obtained by the plasma is incompatible with molecular bonding.

Figure 11D:
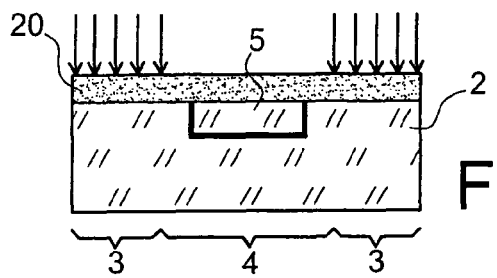

It is possible to define the anchoring zone 3 after the preparation of the buckling layer 6 or during the preparation of the buckling layer 6, but in all in cases, before the buckling. It is possible to provide an energy input 22 at the anchoring zone 3 or the central zone 4 depending on the desired effect. This energy input 22 may be a radiation of an appropriate wavelength (FIG. 11D) or a heat input. This energy input 22 can be made from the buckling layer 6 and/or from the substrate 2. It may involve a localised melting by laser of at least one sub-layer of the buckling layer 6 at the anchoring zone 3, or a melting obtained by infrared radiation. As an alternative, exposure to ultraviolet radiation at the anchoring zone 3 increases the adhesion of the buckling layer 6 to the substrate 2.

Exposure to ultraviolet radiation may chemically deactivate the adhesive effect of a cement. For example, a UV adhesive film from Nitto Denko used for cutting out silicon wafers is easily detached when subjected to ultraviolet radiation.

Obviously, such a localised energy input 22 may be combined with the treatment or the deposition applied to the substrate 2 or to the buckling layer 6 before assembly between the buckling layer 6 and the substrate 2 or before the deposition of the buckling layer 6 on the substrate 2.

Figure 12A:
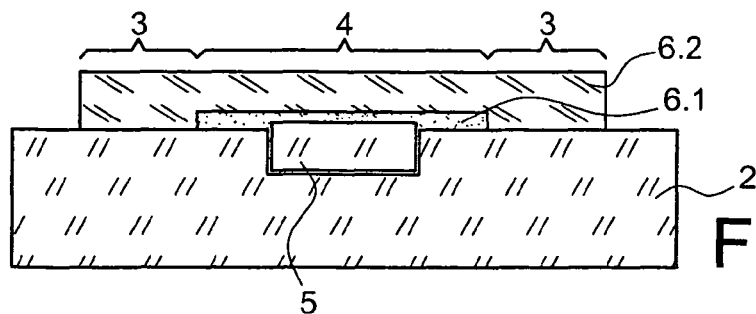
FIGS. 12A to 12D show steps in the preparation of an example of a cover for a mass produced microsystem and FIG. 12E is a graph showing the variation in the deflection as a function of the thickness of the oxide film of the buckling layer.
Figure 12B:
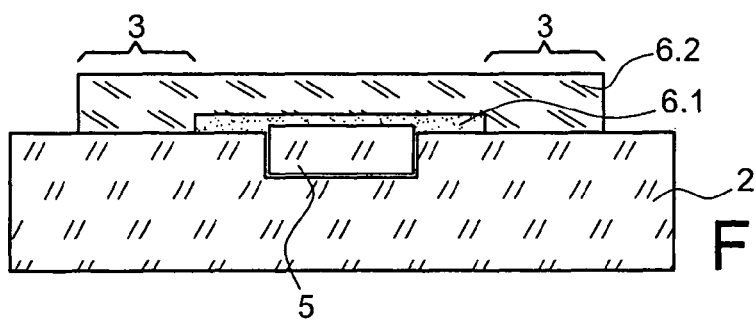

We shall now consider an advantageous embodiment, designed to encapsulate low cost Microsystems, to be produced in large volumes. This concerns, for example, Bulk Acoustic Wave (BAW) filters or radiofrequency MEMS. Reference can be made to FIG. 12A. We begin with a silicon substrate incorporating the microsystem 5. A sub-layer 6.1 of parylene is deposited by gas spraying on the substrate 1, and covers the microsystem 5. Its pattern is delimited by a photolithography step followed by etching (FIG. 12A). The delimitation of its pattern defines the central zone 4. The anchoring zone 3 is located beyond the central zone 4. A second buckling sub-layer 6.2 of silicon dioxide is deposited on the first surface of the substrate 2. Its pattern is delimited by a photolithographic step followed by etching (FIG. 12B). The second sub-layer 6.2 extends beyond the first sub-layer 6.1 and comes into contact with the substrate 2 at the anchoring zone 3. It adheres to the substrate 2 at the anchoring zone 3. It contributes to defining the anchoring zone 3.

Figure 12C:
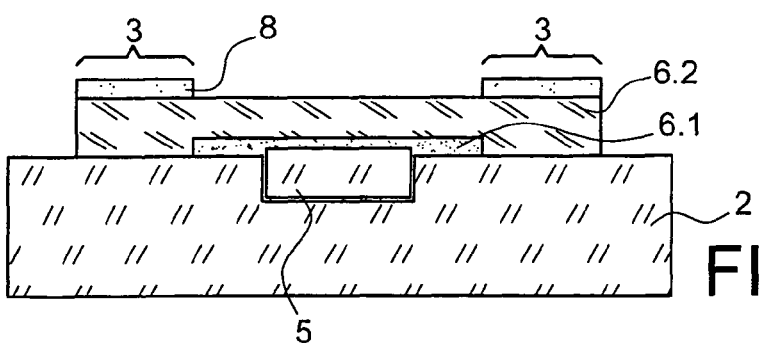

Optionally, a third sub-layer (not referenced) can be deposited which, after a pattern delimitation step by photolithography and etching gives one or more compression elements 8, at the edge of the second sub-layer 6.2 (FIG. 12C). They extend exclusively to the anchoring zone 3. They may be prepared from titanium nitride TiN.

Figure 12D:
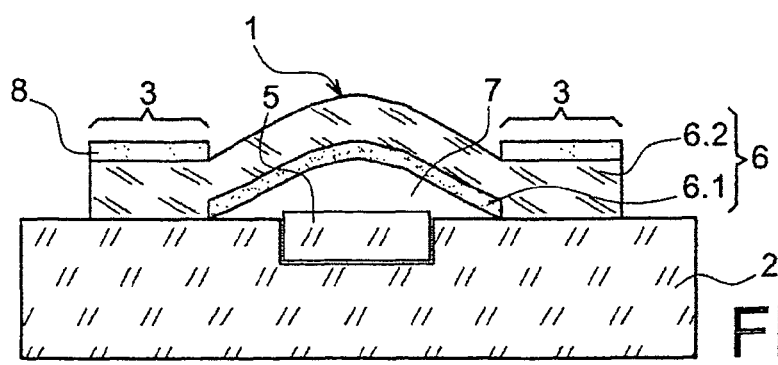
Figure 12E:
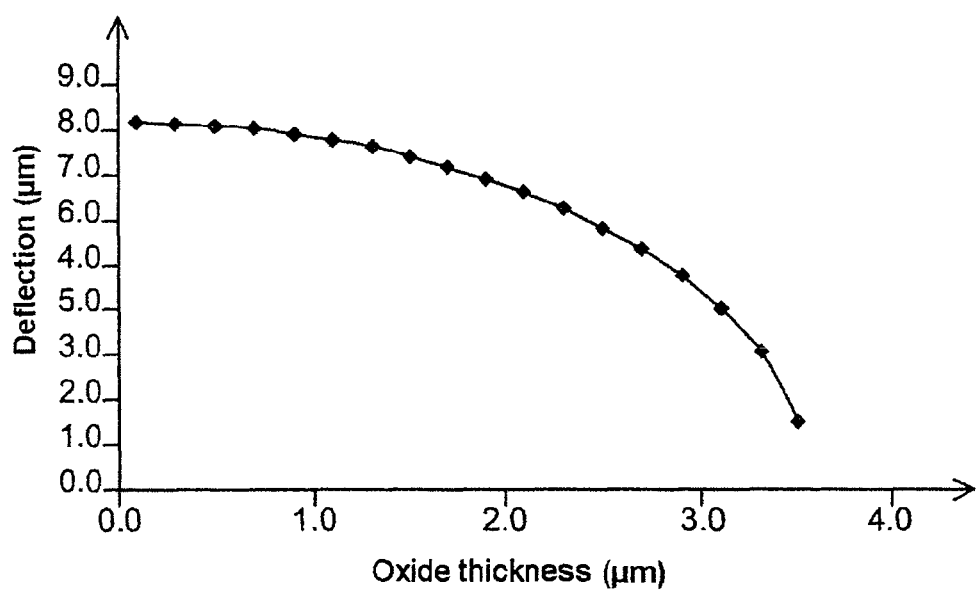

The buckling layer 6 is then buckled (FIG. 12D).

The first parylene sub-layer 6.1 has the function of preventing the rest of the buckling layer 6 from adhering to the substrate 2 at the central zone 4. The thickness of the first buckling sub-layer 6.1 may be a few tenths of microns to a few microns insofar as it has no mechanical role. Parylene is a material which adheres better to silicon dioxide than to silicon, as reported in the document "Parylene flexible neural probe with micro fluidic channel" by Shoji. TAKEUCHI et al., IEEE 2004, pages 208-211. In consequence, it remains joined to the second oxide sub-layer 6.2 during the buckling and does not adhere to the substrate 2.

The second sub-layer 6.2 has the function not only of providing the buckling but also of ensuring the mechanical strength of the cover 1 once the buckling is obtained, and also the anchoring of the cover 1 to the substrate 2.

Studies on the buckling of membranes are described in the literature, for example in the articles "Buckled membranes for microstructures" Dan S. POPESCU et al., 0-7803-1833-1/94 IEEE 1994, pages 188-192 and "Silicon active microvalves using buckled membranes for actuation", Dan S. POPESCU et al., Transducers '95, the 8th International Conference on solid-state sensors and actuators, and Eurosensors IX, Stockholm, Sweden, 25-29 Jun. 1995, pages 305-308. In these studies, in operation, the membranes are designed to be mobile according to the pressure that is applied to them and in certain applications, are intended to pass from one state to another. The membranes investigated in these studies are anchored at their periphery to a support or frame and both of their main faces are in contact with the ambient air.

In the present invention, only one side of the buckling layer is in contact with the ambient air, the other face being in contact with the substrate before the buckling but not with the ambient air.

The critical buckling stress, that is the minimum compressor stress necessary to initiate the buckling of a square membrane satisfy the following equation:

$$\sigma_{cr} = 4.38 \times \frac{h^2}{a^2} \times \frac{E}{1-v^2}$$

where $\sigma_{cr}$ is the critical buckling stress
h is the thickness of the membrane
a is the length of the membrane between the anchorings
E is the Young's modulus of the membrane
and v is the Poisson's ratio.

The associated deflection $W_0$ depends on the stress in the membrane and satisfies the following equation:

$$W_0 = \pm 2.298 \times h \cdot \sqrt{\frac{\sigma}{\sigma_{cr}} - 1} \quad \text{for } \sigma \geq \sigma_{cr}$$

The buckling layer 6 which gives the cover 1 can be treated as a membrane. In our example in FIG. 12, according to the formation method selected for the second sub-layer 6.2 of silicon dioxide, that is thermal oxidation, PECVD deposition, etc., the internal stress level in the buckling layer is more or less high, and is between about 50 and 300 MPa. The temperature required to obtain the thermal oxide has a value of about 1000° C. In general, the higher the temperature during formation, the higher the internal compressive stress of the oxide. However, the temperature for obtaining the oxide must be compatible with the maximum service temperature of the first sub-layer 6.1 of parylene to avoid damaging it. Recent developments on parylene tend to imply deposition temperatures of a few hundreds of degrees as indicated by the article "New High Temperature Polymer Thin Coating for Power Electronics" Rakesh Kumar et al. IEEE 2004, pages 1247-1249. Thus, a second oxide sub-layer 6.2 can be selected with an internal stress of 100 MPa. This value is located in the bottom of the range on account of the temperature limitation.

This internal stress must therefore be sufficient to initiate the buckling of the buckling layer 6 on the assumption that the compression elements are absent. We obtain:

$$100 \text{ MPa} \geq 4.38 \times \frac{h^2}{a^2} \times \frac{E}{1-v^2}$$

It is assumed that the microsystem has a square shape of which the side measures 200 microns. The Young's modulus of silicon dioxide is 70 GPa, its Poisson's ratio v is about 0.17. For such a configuration, it can be inferred that the thickness h of the second sub-layer 6.2 must be less than 3.56 microns. This thickness range is compatible with thin film deposition and etching processes. The lower the thickness h of the second sub-layer 6.2, the higher the deflection $W_0$, as may be observed by referring to the graph in FIG. 12E.

On the contrary, the lower the thickness h of the second sub-layer 6.2, the lower the mechanical strength of the buckling layer 6. Hence, to withstand external mechanical loads such as subsequent assembly operations, and to permit the buckling of the buckling layer 6, a compromise is necessary in terms of thickness. This compromise can be determined experimentally and iteratively.

In order to better withstand the external mechanical loads, it may be advantageous to increase the thickness h of the second oxide sub-layer 6.2 and to add one or more compression elements 8 to permit the buckling of the buckling layer 6 and to exceed the critical stress. These compression elements 8 are selected to have a high expansion coefficient, for example higher than $10^{-6}$ mm/K and a high Young's modulus, for example a few tens or a few hundreds of GPa. The higher the Young's modulus, expansion coefficient and thickness of the compression elements 8, the more effective the compression elements.

It should be observed that certain parameters have been ignored in the preceding calculations. These include on the one hand the pressure difference between the atmospheric pressure surrounding the microsystem 5 and the pressure inside the cavity 7 appearing after the buckling of the buckling layer 6, and on the other, the adhesion of the buckling layer 6 to the substrate 2 which is not zero, according to the configurations selected. It should be anticipated that the real critical buckling stress will be higher than the theoretical critical buckling stress mentioned above.

We shall now consider another embodiment of at least one cover 1 for protecting a microsystem 5. For example of the inertial sensor type such as a gyroscope or an accelerometer. Reference can be made to FIGS. 13A to 13D. This type of microsystem operates under vacuum and is relatively costly, and is fabricated in small quantities. Preparation is different and more complex than described above. It is assumed that the microsystem 5 is a square with side a having the value of 5 mm×5 mm for example. The microsystem 5 has at least one mobile sensitive element, which is the visible part in the FIG. 13. Since the cavity 7 must remain under vacuum, it is not desirable to use an organic material to make the buckling layer, because of a risk of degassing.

Figure 13A:
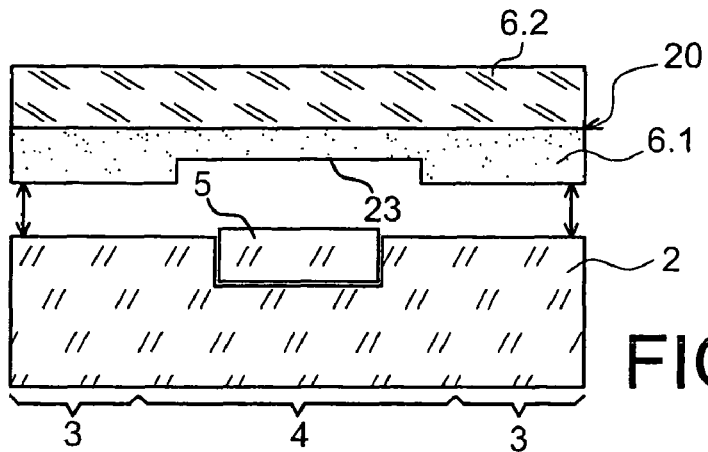
FIGS. 13A to 13C show steps in the preparation of example of a sealed cover for microsystem and FIG. 13D is graph showing the variation in the deflection as a function of the thickness of the buckling layer.

We start with a substrate 2 housing the microsystem 5. It is assumed to be made from silicon. A central zone 4 is defined at the surface including the microsystem 5 and at least one anchoring zone 3 on which the buckling layer which will ultimately yield the cover is anchored (FIG. 13A).

The buckling layer 6 is made from a second substrate 20, also shown in FIG. 12A, formed of a stack of silicon sub-layers 6.2 and a thermal silicon dioxide sub-layer 6.1. The second substrate 20 has a geometry adapted to that of the union between the central zone 4 and the anchoring zone 3. The said second substrate 20 is joined to the first 2 by direct silicon-to-silicon welding, eutectic welding, anodic bonding for example.

Figure 13B:
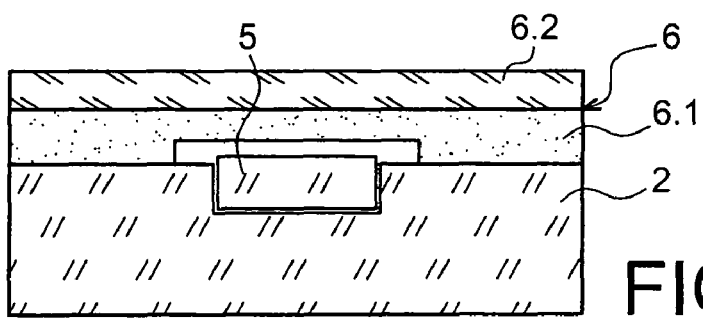
Figure 13C:
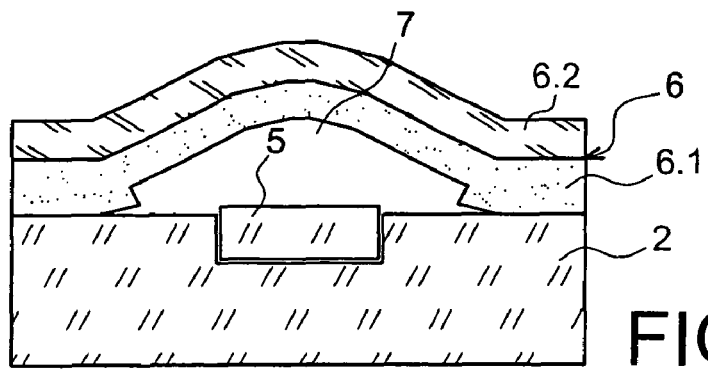
Figure 13D:
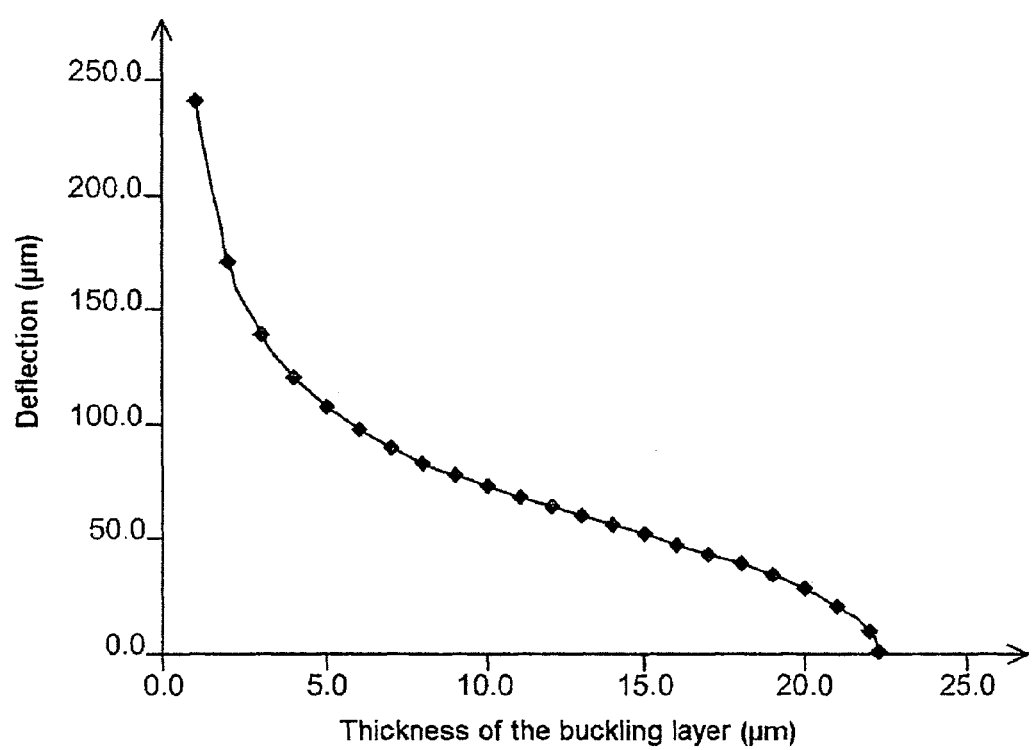

The thermal oxide sub-layer 6.1 is located on the side of the first substrate 2 (FIG. 13B). It is assumed that the thermal oxide sub-layer 6.1 has a thickness of about 1 micron and an internal compressive stress of about 300 MPa, which is high.

Contrary to the conventional covers which are bowl-shaped to give the cavity its volume, in the invention, it is unnecessary for the second substrate 20 to have a depression. It is the buckling which gives the cavity 7 its volume. It may be flat as shown in FIG. 11. In the example in FIG. 13, however, a slight depression 23 is provided in the thermal oxide, which is located after joining the two substrates 2, 20 above the central zone 4 and hence above the microsystem 5. It may be obtained by dry etching, for example by reactive ion etching (RIE) based on $CHF_3O_2$. The fact of providing a slight depression 23 serves to ensure that the second substrate 20 will not adhere to the first 2 at the central zone 4 during the assembly. If there is no depression, the roughness of the thermal oxide can be increased to a level higher than about 100 nm rms (mean surface roughness) at the part of the second substrate 20 located at the level of the central zone 4, as described above.

After the assembly step, a thinning of the second substrate 20, on the silicon side, is provided, to obtain a buckling layer 6 and to give it an appropriate thickness for the desired deflection during the buckling (FIG. 13B). The silicon sub-layer 6.2 could be thinned and etched until it totally disappears. The buckling layer 6 would then be a monolayer and would have a maximum stress.

In the example described in FIG. 13B, the thermal oxide sub-layer 6.1 is preserved as well as a residual silicon sub-layer 6.2. The article entitled "Buckled membranes for microstructures" of which the references were given above, discloses the equation between the minimum thickness $h_{SiO2}$ of the oxide sub-layer 6.1 necessary for buckling:

$$h_{SiO_2} = 2263 \frac{h^3}{a^2}$$

where h is the total thickness of the buckling layer and a is the width of the buckling layer between the anchorings.

Above this thickness, the deflection after buckling is defined by the following equation:

$$W_0 = 2.298 \times h \times \sqrt{4.419 \times 10^{-4} \cdot \frac{h_{SiO_2}}{h} \frac{a^2}{h^2} - 1}$$

In our example, it is assumed that: a=5 mm and $h_{SiO2}$=1 μm. The variation in deflection as a function of thickness h is shown in the graph in FIG. 13D. The thickness of the residual silicon sub-layer 6.2 can thus be optimized in order to obtain a desired deflection $W_0$ for the buckling layer 6. For a deflection of 50 to 100 μm; the thickness of the residual silicon sub-layer 6.2 is about 5 to 15 μm. This deflection is directly related to the volume of the cavity 7 after buckling. In fact, the deformation of the buckling layer 6 is given by the formula below:

$$W(x, y) = \frac{W_0}{4}\left(1 + \cos\frac{2\pi}{a}x\right)\left(1 + \cos\frac{2\pi}{a}y\right)$$

By integrating this deformation over the entire surface of the buckling layer 6, the volume of the cavity 7 is thus determined.

The present invention proposes an alternative solution to the two conventional microsystem encapsulation technologies: thin film encapsulation and encapsulation by bonding of a silicon cover etched in a substrate. On the basis of this invention, a multitude of alternatives can be identified according to the application of the system to the component to be protected.

A first advantage of this invention is to propose an effective solution in particular for microsystems intended for large volume production (radiofrequency MEMS, bulk acoustic wave filters). Today, the preferred method for this category of microsystems is thin film encapsulation. The advantages of the method according to the invention with regard to thin film encapsulation are as follows. There is no longer any need to use a sacrificial layer, there is no need to plug the cover obtained. This simplification is beneficial for both manufacturing costs, since the production is higher, and for cycle time. The cover obtained in the invention is more robust for bend strength. In fact, since the buckling layer is under stress, its bending strength is improved. The cover thereby defined therefore withstands external loads better. Depending on the geometry of the component and the design of the buckling layer, it is possible to find a configuration withstanding plastic injection. Conventional thin film covers do not withstand plastic injection. This prospect is highly encouraging because it would permit the treatment of the microsystems thus encapsulated like any other component. With this possibility of mechanical strength, the use of a sol gel for the buckling layer 6 may be advantageous insofar as the thicknesses deposited may be higher while having a limited thermal expansion coefficient, similar to that of silicon dioxide. The sol gel is selected according to its adhesion, its porosity, its thermal expansion coefficient, its Young's modulus and its position in the stack of the buckling layer. This is not a standard product.

Another potential solution consists in using a compression mode of the buckling layer that is other than thermal, by ion implantation for example, as described in FIG. 9. Thus, during the temperature ramp up associated with plastic injection (typically at 180° C.), the compressive stress in the buckling layer is temporarily increased thanks to the additional coating and thanks to the substrate itself if it has been selected so that the buckling layer has a thermal expansion coefficient higher than that of the substrate. The bending strength of the buckling layer is improved exclusively during the temperature rise. The advantages of thin film encapsulation are preserved, such as the use of integrated circuit technologies, low temperatures and limited thickness of the encapsulated microsystem.

The present invention has advantages over encapsulation with a bonded cover obtained in a substrate. The larger volume generated by the buckling of the buckling layer during the creation of the cavity contributes to decreasing the pressure in the cavity, because as a first approximation, the product of pressure×volume is constant. This prospect is advantageous for microsystems operating under vacuum, in addition to the getter effect. It is possible for one of the sub-layers of the buckling layer to have this getter function as discussed above.

The final volume of the cavity can be adjusted by the stress level in the buckling layer (deposition temperature, thickness of compression elements, etc.) or by the mechanical strength of the buckling layer (thickness). The present invention therefore serves to adjust the vacuum level in the cavity and thereby make the operation of the component uniform, by limiting the dispersion caused by the level of vacuum. This adjustment can be made during fabrication but also after fabrication (after electrical test) or even during the life of the product.

In this latter case, for the compression element 8, it would then be necessary to provide an actuation controlled by the application (for example a known piezoelectric actuation). It is assumed that such a piezoelectric actuation is shown schematically in FIG. 12D.

Although several embodiments of the present invention have been represented and described in detail, it should be understood that various changes and modifications can be made while remaining within the scope of the invention.

The invention claimed is:

1. Method for preparing a cover for protecting a component housed on or in a substrate comprising the following steps:
    definition on the substrate of at least one zone for anchoring the cover on the substrate, offset from a central zone in which the component is located,
    formation of a buckling layer comprising one or more component layers on the substrate, extending on the central zone and beyond, the buckling layer having an adhesion to the substrate, in the central zone, lower than that presented in the anchoring zone,
    buckling of the buckling layer to give a convex shape to the buckling layer and creating a cavity at the central zone, the convex shape relating to an inside of the cavity, the buckling layer being anchored to the substrate at the anchoring zone,
    wherein the definition on the substrate can be carried out before, during or after the formation step but before the buckling step, and the buckling step can be carried out during or after the formation step.

2. Method according to claim 1, in which the buckling layer is formed by the deposition of a thin film such as chemical vapour deposition, physical vapour deposition, electrolysis, epitaxy, thermal oxidation, vacuum deposition, film lamination, spin deposition, spraying, moulding, molecular bonding, eutectic welding, anodic bonding, organic bonding.

3. Method according to claim 1, in which the formation of the buckling layer includes a step of structuring of the buckling layer.

4. Method according to claim 3, in which the buckling layer is made from an organic material selected from photosensitive resins such as benzocyclobutene or polyethylene terephthalate, parylene, polydimethylsiloxane, a metallic material selected from titanium, carbon, aluminium or alloys thereof, an inorganic material selected from silicon, silicon germanium, silicon dioxide, silicon nitride, silicon carbide, diamond carbon, titanium nitride.

5. Method according to claim 1, in which the buckling is carried out by maintaining the buckling layer under stress following a heat treatment.

6. Method according to claim 5, in which the stress is induced by the substrate which has a thermal expansion coefficient higher than that of the buckling layer or of the buckling sub-layer.

7. Method according to claim 5, in which the stress is induced by at least one sub-layer of the buckling layer which has a thermal expansion coefficient higher than that of another sub-layer of the buckling layer.

8. Method according to claim 5, comprising a step of formation of at least one compression element at the periphery of the buckling layer, at the anchoring zone, the said compression element having a thermal expansion coefficient higher than that of the buckling layer or of at least one of the sub-layers of the buckling layer and a stiffness higher than that of the buckling layer, the stress being induced by the compression element.

9. Method according to claim 1, in which the buckling is obtained by a localized ion implantation of the buckling layer coupled with a simultaneous and/or subsequent thermal activation.

10. Method according to claim 9, comprising a step of depositing a coating having a thermal expansion coefficient lower than that of the buckling layer at the periphery of the buckling layer, after the buckling, this deposition step being followed by a heat treatment step.

11. Method according to claim 1, in which the buckling is obtained by epitaxial stress deposition of at least one sub-layer of the buckling layer, the said step optionally being coupled with a heat treatment.

12. Method according to claim 1, in which the buckling is obtained by plasma hardening of at least one sub-layer of the buckling layer, the said step optionally being coupled with a heat treatment.

13. Method according to claim 8, in which the compression element is subject to an ion implantation, a plasma hardening, an epitaxial stress deposition.

14. Method according to claim 1, in which the anchoring zone is defined by the preparation of one or more anchoring points of the buckling layer, hollowed in the substrate, beyond the central zone, before the formation of the buckling layer.

15. Method according to claim 14, in which the anchoring zone is defined by localized treatment of the substrate and/or of the buckling layer in order to increase the adhesion of the buckling layer to the substrate beyond the central zone.

16. Method according to claim 15, in which the treatment is an oxygen plasma application to increase the surface roughness or to chemically activate the surface.

17. Method according to claim 16, in which the anchoring zone is defined by localized deposition on the substrate and/or the buckling layer of a material suitable for increasing the adhesion of the buckling layer to the substrate beyond the central zone.

18. Method according to claim 17, in which the material is an adhesive, a eutectic weld, a bonding primer.

19. Method according to claim 18, in which the anchoring zone is defined by localized deposition on the substrate and/or the buckling layer of a material suitable for decreasing the adhesion of the buckling layer to the substrate beyond the central zone.

20. Method according to claim 19, in which the material is a slightly adhesive or non-adhesive material selected from polytetrafluoroethylene, silicones, parylene, polydimethysiloxane, photosensitive resins.

21. Method according to claim 19, in which the material is a material suitable for being evaporated or for being thermally degraded, the buckling layer having a first porous sub-layer which is covered with at least one of the sub-layer after the evaporation or the degradation of the material.

22. Method according to claim 21, in which the material is aqueous or a photosensitive resin based on polycarbonate.

23. Method according to claim 21, in which a heat treatment step or a controlled pressurization step is provided after the evaporation or the degradation to permit the removal of waste material.

24. Method according to claim 23, in which the anchoring zone is defined by localized treatment of the substrate and/or the buckling layer suitable for decreasing the adhesion of the buckling layer to the substrate beyond the central zone.

25. Method according to claim 24, in which the treatment is a plasma treatment for increasing the surface roughness.

26. Method according to claim 25, in which the anchoring zone is defined by localized energy input, across the superimposed substrate and buckling layer even if the said definition is incomplete beyond the central zone.

* * * * *